United States Patent
Tajima

(10) Patent No.: US 10,620,239 B2
(45) Date of Patent: Apr. 14, 2020

(54) CURRENT DETECTION IN A SEMICONDUCTOR DEVICE

(71) Applicant: RENESAS ELECTRONICS CORPORATION, Tokyo (JP)

(72) Inventor: Hideyuki Tajima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/250,365

(22) Filed: Jan. 17, 2019

(65) Prior Publication Data
US 2019/0265744 A1    Aug. 29, 2019

(30) Foreign Application Priority Data

Feb. 23, 2018    (JP) .................................. 2018-030671

(51) Int. Cl.
*G01R 19/165* (2006.01)
*G05F 3/24* (2006.01)
(Continued)

(52) U.S. Cl.
CPC ............ *G01R 19/165* (2013.01); *G05F 3/247* (2013.01); *H02M 2001/0009* (2013.01);
(Continued)

(58) Field of Classification Search
CPC ......... H02M 2001/0009; H02M 3/156; H02M 3/1563; H02M 3/157; H02M 2001/0029;
(Continued)

(56) References Cited

U.S. PATENT DOCUMENTS 6,377,034 B1    4/2002 Ivanov
8,710,819 B2*   4/2014 Chen ...................... G05F 1/561
                                            323/285
(Continued)

FOREIGN PATENT DOCUMENTS

JP    5820291 B2    11/2015

OTHER PUBLICATIONS

Extended European Search Report issued in corresponding European Patent Application No. 19150617.9-1203, dated Jul. 19, 2019.

*Primary Examiner* — Alex Torres-Rivera
(74) *Attorney, Agent, or Firm* — McDermott Will & Emery LLP

(57) ABSTRACT

A semiconductor device includes: a drive transistor controlling current supply to a load; a current detector unit detecting a current of a sense transistor through which a current proportional to the current flowing through the drive transistor flows; a controller unit generating a pulse signal with a duty ratio corresponding to the detection result of the current detector unit; a voltage monitor monitoring whether a voltage of an external output terminal reaches a battery voltage; and a pre-driver performing charge and discharge to a control terminal of the drive transistor based on the pulse signal. The pre-driver performs the charge and discharge to the control terminal of the drive transistor at a first speed, when the voltage of the external output terminal reaches the battery voltage, and at a speed faster than the first speed, when the voltage of the external output terminal reaches the battery voltage.

18 Claims, 19 Drawing Sheets

(51) Int. Cl.
  *H03K 17/042* (2006.01)
  *H02M 1/00* (2006.01)
(52) U.S. Cl.
  CPC ..... *H03K 17/042* (2013.01); *H03K 17/04206* (2013.01); *H03K 2217/0027* (2013.01)
(58) Field of Classification Search
  CPC .... B06L 1/00; B60R 16/03; H02J 7/14; H02J 9/002; G01R 19/165
  USPC ................ 307/9.1, 10.1, 10.3, 10.6
  See application file for complete search history.

(56) References Cited

U.S. PATENT DOCUMENTS

| | | | | |
|---|---|---|---|---|
| 9,442,503 | B2* | 9/2016 | Rutkowski | G05F 1/618 |
| 10,075,076 | B1* | 9/2018 | Tadeparthy | H02M 1/08 |
| 10,333,509 | B2* | 6/2019 | Kaeriyama | H03K 17/0406 |
| 2004/0070906 | A1* | 4/2004 | Kohout | H02M 3/1588 |
| | | | | 361/92 |
| 2007/0103005 | A1* | 5/2007 | Nagasawa | H02M 3/156 |
| | | | | 307/125 |
| 2007/0229050 | A1* | 10/2007 | Shigeta | H03K 17/0822 |
| | | | | 323/282 |
| 2008/0290911 | A1 | 11/2008 | Williams | |
| 2009/0273325 | A1* | 11/2009 | Nakahashi | H02M 3/156 |
| | | | | 323/282 |
| 2010/0127684 | A1* | 5/2010 | Iliasevitch | H02M 3/1588 |
| | | | | 323/285 |
| 2010/0156362 | A1* | 6/2010 | Xie | G05F 1/565 |
| | | | | 323/273 |
| 2010/0164553 | A1* | 7/2010 | Ha | H02M 3/156 |
| | | | | 327/103 |
| 2010/0320979 | A1* | 12/2010 | Lu | H02M 3/156 |
| | | | | 323/282 |
| 2011/0068762 | A1* | 3/2011 | Nishida | G01R 19/0092 |
| | | | | 323/282 |
| 2012/0194151 | A1* | 8/2012 | Gunther | G05F 1/56 |
| | | | | 323/282 |
| 2012/0286752 | A1* | 11/2012 | Tsukiji | H02M 3/156 |
| | | | | 323/282 |
| 2016/0112043 | A1* | 4/2016 | Hayashiguchi | H03K 17/08122 |
| 2016/0218611 | A1* | 7/2016 | Lollio | H02M 3/1588 |
| 2016/0352319 | A1* | 12/2016 | Nagase | H02M 1/32 |
| 2017/0279357 | A1* | 9/2017 | Tajima | G01R 31/40 |
| 2019/0181853 | A1* | 6/2019 | Kobayashi | H03K 17/162 |

* cited by examiner

CURRENT DETECTION IN A SEMICONDUCTOR DEVICE

CROSS-REFERENCE TO RELATED APPLICATIONS

The disclosure of Japanese Patent Application No. 2018-030671 filed on Feb. 23, 2018 including the specification, drawings and abstract is incorporated herein by reference in its entirety.

BACKGROUND

The present invention relates to a semiconductor device, a semiconductor system, and a control system, and relates to a semiconductor device, a semiconductor system, and a control system, suitable for improving current detection accuracy, for example.

A vehicle is mounted with an electronic control unit (a semiconductor device) for controlling supply of a current to a solenoid valve that controls opening and closing of a clutch. By controlling the supply of the current for the solenoid valve and controlling the opening and closing of the clutch, the electronic control unit transmits and cuts off the driving force of the engine to the transmission, at the time of start, stop, and speed change of the vehicle. Here, the electronic control unit is required to perform the opening and closing of the clutch correctly by controlling the supply of the current for the solenoid valve with sufficient accuracy.

Therefore, the electronic control unit is provided with a current detection circuit that detects whether the value of the current outputted from a solenoid driver indicates a normal value. Naturally, this current detection circuit is required to detect the current with a high degree of accuracy.

As the current detection circuit with a high degree of the current detection accuracy, a current detection circuit that detects the current flowing through a driver using a shunt resistor is known. However, there has been a problem that the current detection circuit using the shunt resistor system has an increased circuit scale.

One of the solutions for such a problem is disclosed by Patent Literature 1. Patent Literature 1 discloses the configuration of the current detection circuit that detects the current flowing through the driver concerned using a sense transistor through which a current proportional to the current flowing through the driver flows. Accordingly, the increase of the circuit scale is suppressed.

(Patent Literature 1) U.S. Pat. No. 6,377,034 Specification

SUMMARY

However, in the configuration according to Patent Literature 1, there is a problem that it is difficult to detect the current flowing through the driver with sufficient accuracy. The other issues and new features of the present invention will become clear from the description of the present specification and the accompanying drawings.

According to one embodiment, a semiconductor device includes: a first drive transistor to control supply of a current flowing through a load provided externally; a current detector unit that includes a first sense transistor through which a current proportional to the current flowing through the first drive transistor flows and that detects the current flowing through the first sense transistor; a controller unit to generate a first pulse signal with a duty ratio corresponding to a value of the current detected by the current detector unit; a voltage monitor to monitor whether a voltage of an external output terminal provided between the first drive transistor and the load has reached a prescribed voltage; and a pre-driver to perform charge and discharge to a control terminal of a first drive transistor based on the first pulse signal. Here, the pre-driver performs the charge and discharge to the control terminal of the first drive transistor at a first charge and discharge speed, when the voltage of the external output terminal has not reached the prescribed voltage, and at a second charge and discharge speed faster than the first charge and discharge speed, when the voltage of the external output terminal has reached the prescribed voltage.

According to the one embodiment, it is possible to provide a semiconductor device and a semiconductor system that can improve the current detection accuracy.

DETAILED DESCRIPTION

Figure 1:
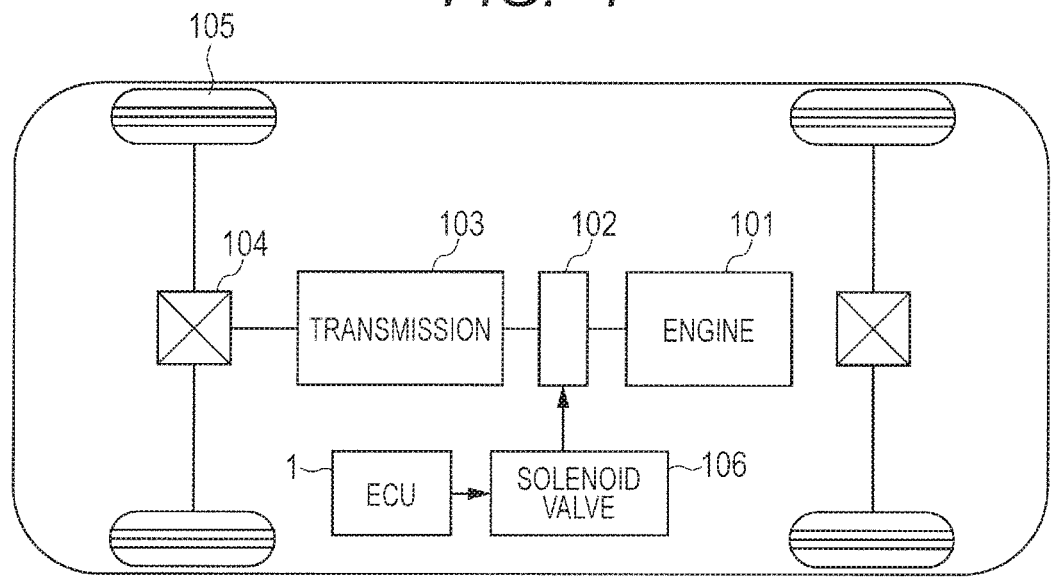
FIG. 1 is an outline view of a vehicle mounted with an electronic control unit according to Embodiment 1.

In the following descriptions and drawings, abbreviation and simplification are properly made for clarification of explanation. Each element described on the drawings as functional blocks performing various processing can be configured hardware-wise with a CPU (Central Processing Unit), a memory, and other circuits, and can be realized software-wise by a program loaded to a memory. Consequently, it is understood by the person skilled in the art that these functional blocks can be realized in various forms by only hardware, only software, or those combination, and it is not restricted to one of the forms. In each drawing, the same symbol or reference numeral is attached to the same element and the repeated explanation thereof is omitted properly.

The above-described program can be stored using various types of non-transitory computer readable media, and can be supplied to the computer. The non-transitory computer readable media include various types of tangible storage media. The example of the non-transitory computer readable media includes a magnetic recording media (for example, a flexible disk, a magnetic tape, and a hard disk drive), an optical magnetic recording media (for example, a magneto-optical disk), a CD-ROM (Read Only Memory), a CD-R, a CD-R/W, a semiconductor memory (for example, a mask ROM, a PROM (a programmable ROM), an EPROM (an erasable PROM), a flash ROM, a RAM (Random Access Memory)). The program may be supplied to the computer by various types of transitory computer readable media. The example of the transitory computer readable media includes an electrical signal, a light signal, and electromagnetic waves. The transitory computer readable media can supply a program to a computer via a wired communication path, such as a wire and an optical fiber, or a wireless communication path.

Embodiment 1

FIG. 1 is an outline view of a vehicle mounted with an ECU (Electronic Control Unit) according to Embodiment 1.

As illustrated in FIG. 1, the vehicle is mounted with an engine 101, a clutch 102, a transmission 103, a differential gear 104, a tire 105, a solenoid valve (load) 106, and an electronic control unit (semiconductor device) 1, for example.

For example, the electronic control unit 1 controls supply of a current flowing through the solenoid valve 106. The solenoid valve 106 converts the current supplied from the solenoid driver into electromagnetic force by an inductor and controls the opening and closing of the clutch 102 using the electromagnetic force. Accordingly, transmission of the driving force of the engine 101 to the transmission 103 at the time of start, stop, and speed change of the vehicle is controlled. The transmission 103 converts the driving force of the engine 101 to the rotational frequency and torque corresponding to a running state, and transfers it to the differential gear 104 to rotate the tire 105.

Here, the electronic control unit 1 is required to correctly perform the opening and closing of the clutch 102, by controlling the supply of the current for the solenoid valve 106 with sufficient accuracy. Therefore, the electronic control unit 1 is provided with a current detector unit that detects whether the value of the current outputted from a solenoid driver indicates a normal value. Naturally, this current detector unit is required to detect the current with a high degree of accuracy.

(Preliminary Examination by the Inventors)

Before explaining the details of the electronic control unit 1 mounted in the vehicle described above, an electronic control unit 50 that the present inventors have examined preliminarily is first explained with reference to FIG. 19-FIG. 21.

(Configuration of the Electronic Control Unit 50)

Figure 19:
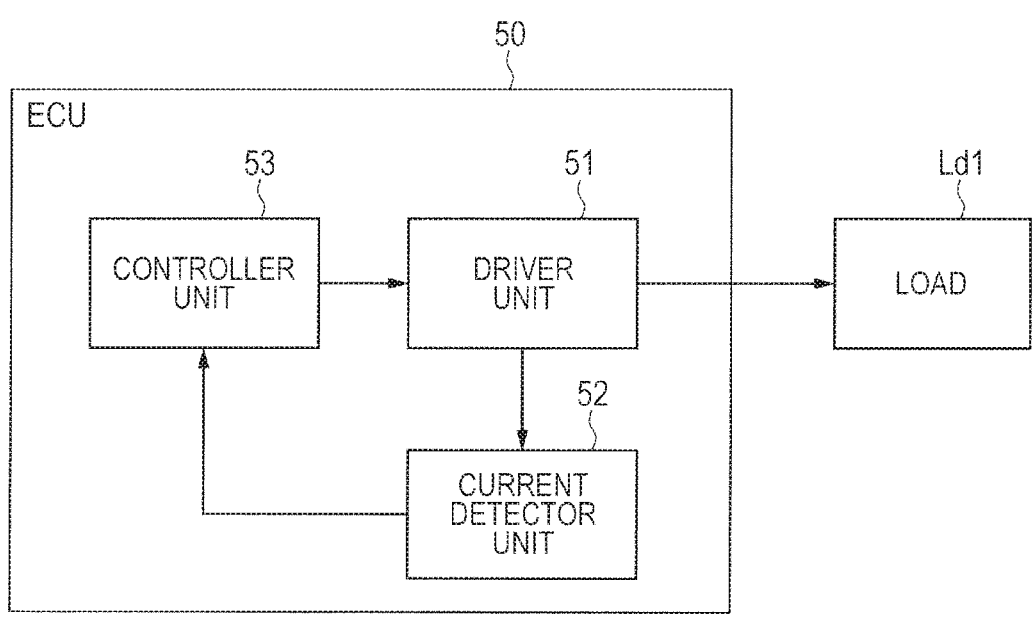
FIG. 19 is a block diagram illustrating an example of the configuration of an electronic control unit according to the concept before arriving at Embodiment 1.

FIG. 19 is a block diagram illustrating an example of the configuration of the electronic control unit 50 according to the concept before arriving at Embodiment 1. FIG. 19 illustrates also a load Ld1 of which the supply of a current is controlled by the electronic control unit 50.

As illustrated in FIG. 19, the electronic control unit 50 includes a driver unit 51 that drives the load Ld1, a current detector unit 52 that detects an output current of the driver unit 51, and a controller unit 53 that controls the drive of the load Ld1 by the driver unit 51 based on the detection result of the current detector unit 52.

Figure 20:
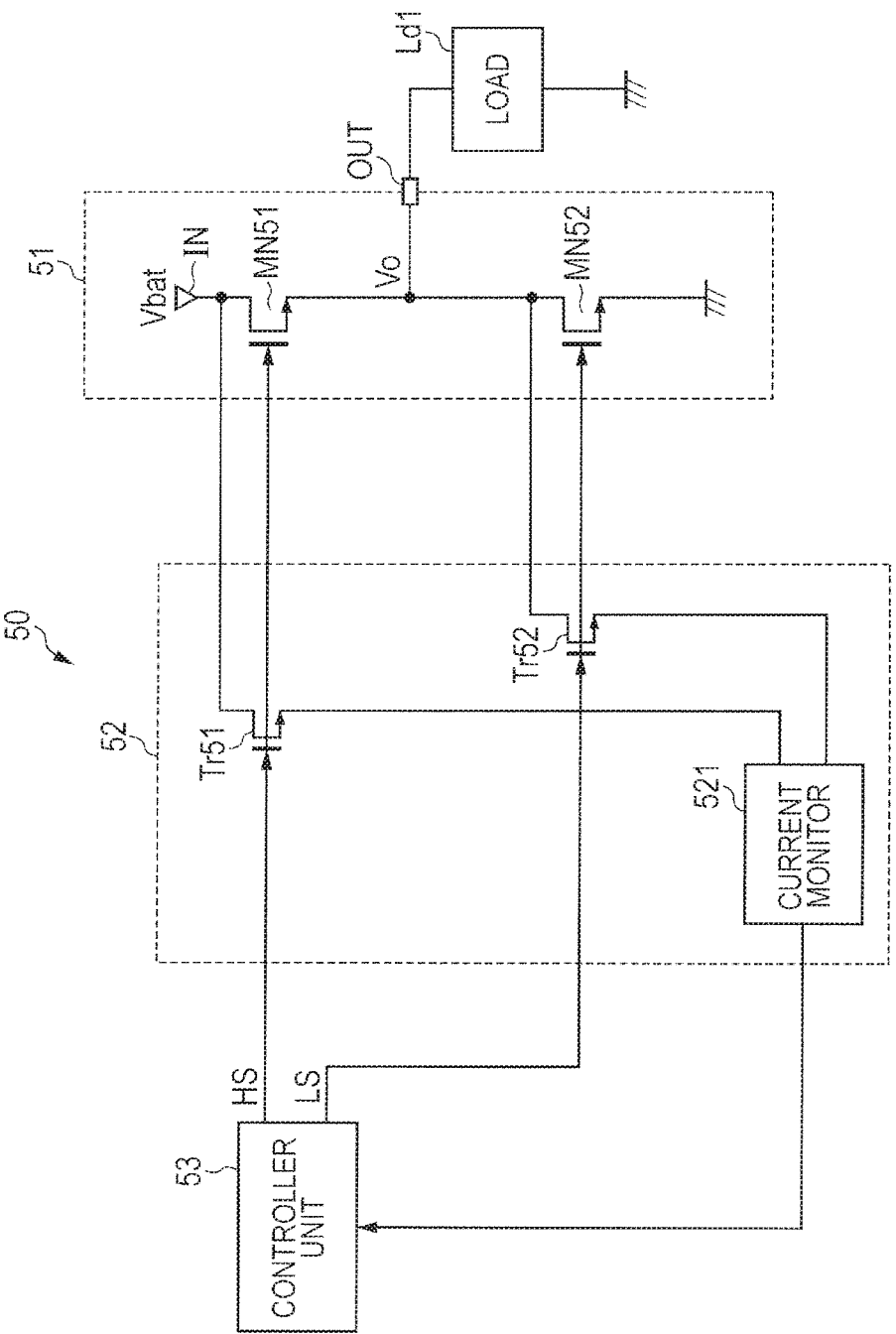
FIG. 20 is a drawing illustrating a concrete example of the configuration of the electronic control unit illustrated in FIG. 19.

FIG. 20 is a drawing illustrating a concrete example of the configuration of the electronic control unit 50 illustrated in FIG. 19. As illustrated in FIG. 20, in the electronic control unit 50, the driver unit 51 includes a drive transistor MN51 and a drive transistor MN52, and the current detector unit 52 includes a sense transistor Tr51, a sense transistor Tr52, and a current monitor 521.

The drive transistor MN51 is an N-channel MOS transistor of a high withstand voltage, for example, and is used as a high-potential-side driver. Specifically, the drive transistor MN51 controls the current flowing through a path between a voltage supplying terminal IN to which a battery voltage Vbat is supplied and an external output terminal OUT coupled to the load Ld1, based on a pulse signal HS outputted from the controller unit 53.

The drive transistor MN52 is an N-channel MOS transistor of a high withstand voltage, for example, and is used as a low-potential-side driver. Specifically, the drive transistor MN52 controls the current flowing through a path between the external output terminal OUT and a reference voltage terminal to which a reference voltage GND is supplied (hereinafter called a reference voltage terminal GND), based on a pulse signal LS outputted from the controller unit 53.

The load Ld1 is a solenoid valve 106 including an inductor for example, and converts the current supplied from the driver unit 51 into electromagnetic force. The solenoid valve 106 controls oil pressure using the electromagnetic force, and accordingly, controls the opening and closing of the clutch 102.

The sense transistor Tr51 is an N-channel MOS transistor of a high withstand voltage as well as the drive transistor MN51. For example, the transistor size of the sense transistor Tr51 is $1/1000$ time the transistor size of the drive transistor MN51.

Specifically, as for the sense transistor Tr51, the drain is coupled to a voltage supplying terminal IN, the source is coupled to the current monitor 521, and the gate is supplied with the pulse signal HS. Therefore, a current proportional to (specifically $1/1000$ time as much) the current flowing through a channel between the source and the drain of the drive transistor MN51 flows through a channel between the source and the drain of the sense transistor Tr51.

The sense transistor Tr52 is an N-channel MOS transistor of a high withstand voltage as well as the drive transistor MN52. For example, the transistor size of the sense transistor Tr52 is 1/1000 time the transistor size of the drive transistor MN52.

Specifically, as for the sense transistor Tr52, the drain is coupled to the external output terminal OUT, the source is coupled to the current monitor 521, and the gate is supplied with the pulse signal LS. Therefore, a current proportional to (specifically 1/1000 time as much) the current flowing through a channel between the source and the drain of the drive transistor MN52 flows through a channel between the source and the drain of the sense transistor Tr52.

The current monitor 521 monitors the current flowing through each of the sense transistors Tr51 and Tr52. The monitored result by the current monitor 521 is outputted as a detection result of the current detector unit 52.

The controller unit 53 drives the drive transistors MN51 and MN52 alternately using the pulse signals HS and LS. Here, the controller unit 53 controls the duty ratio of the pulse signals HS and LS based on the detection result by the current detector unit 52. Accordingly, the driving period of the drive transistors MN51 and MN52 is adjusted.

(Operation of the Electronic Control Unit 50)

Next, the operation of the electronic control unit 50 is explained with reference to FIG. 21. FIG. 21 is a timing chart illustrating the operation of the electronic control unit 50.

Figure 21:
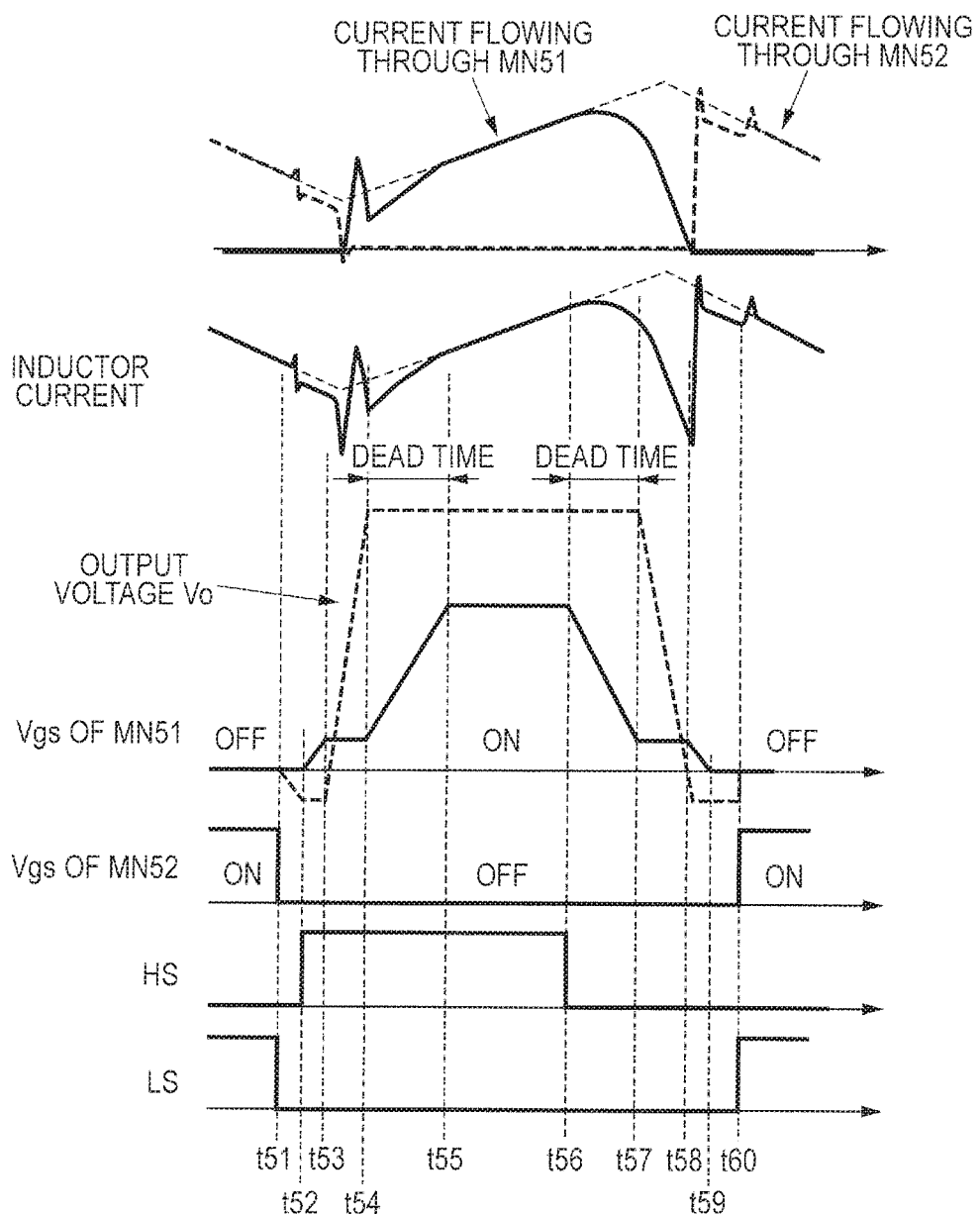
FIG. 21 is a timing chart illustrating operation of the electronic control unit illustrated in FIG. 20.

As illustrated in FIG. 21, first, in the state where the pulse signal HS is at an L level, the pulse signal LS changes from an H level to an L level (Time t51). Accordingly, a gate-to-source voltage Vgs of the drive transistor MN52 becomes less than a threshold voltage Vth, and the drive transistor MN52 changes from ON to OFF (Time t51). At this time, although the drive transistor MN52 switches to OFF, a regenerative current generated by the inductor of the load Ld1 flows through a body diode formed between the drain and the source of the drive transistor MN52. Therefore, a voltage Vo of the external output terminal OUT falls from the reference voltage GND further to a lower value by a voltage drop of the body diode.

Subsequently, in the state where the pulse signal LS is at an L level, the pulse signal HS changes from an L level to an H level (Time t52). Accordingly, the gate-to-source voltage Vgs of the drive transistor MN51 begins to rise (Time t52). Subsequently, when the gate-to-source voltage Vgs of the drive transistor MN51 rises to the threshold voltage Vth, the drive transistor MN51 changes from OFF to ON (Time t53). Accordingly, the path of the current flowing through the load Ld1 changes from the path through the drive transistor MN52 to the path through the drive transistor MN51. At this time, the current will not flow through the drive transistor MN52, and the current detected by the sense transistor Tr52 becomes 0. As opposed to this, the current flowing through the drive transistor MN51 begins to rise and the current detected by the sense transistor Tr51 begins to rise.

When the drive transistor MN51 changes from OFF to ON, the voltage Vo of the external output terminal OUT will begin to rise towards the battery voltage Vbat (Time t53). Here, during the period until the voltage Vo reaches the battery voltage Vbat (Time t53-Time t54), the gate-to-source capacitance Cgs of the drive transistor MN51 does not change apparently. Therefore, the gate-to-source voltage Vgs of the drive transistor MN51 hardly changes (Time t53-Time t54). Subsequently, when the voltage Vo reaches the battery voltage Vbat (Time t54), the gate-to-source capacitance Cgs of the drive transistor MN51 begins to be charged, and the gate-to-source voltage Vgs of the drive transistor MN51 begins to rise again (Time t54), and is stabilized at the upper limit voltage corresponding to an H level (Time t55).

During the period after the drive transistor MN51 changes from OFF to ON until just before the drive transistor MN51 becomes full ON (Time t53-Time t55), the ratio of the current flowing through the drive transistor MN51 to the current flowing through the sense transistor Tr51 is not a desired ratio; accordingly, it is difficult for the current detector unit 52 to perform the current detection with sufficient accuracy.

Subsequently, when a prescribed period passes, in the state where the pulse signal LS is at an L level, the pulse signal HS changes from an H level to an L level (Time t56). Accordingly, the gate-to-source capacitance Cgs of the drive transistor MN51 begins to be discharged, and the gate-to-source voltage Vgs of the drive transistor MN51 begins to fall (Time t56). Subsequently, when the gate-to-source voltage Vgs of the drive transistor MN51 becomes less than the threshold voltage Vth, the drive transistor MN51 changes from ON to OFF (Time t57). Accordingly, the voltage Vo begins to fall (Time t57). Here, during the period when the voltage Vo falls to the reference voltage GND (Time t57-Time t58), the gate-to-source capacitance Cgs of the drive transistor MN51 does not change apparently. Therefore, the gate-to-source voltage Vgs of the drive transistor MN51 hardly changes. Subsequently, when the voltage Vo reaches the reference voltage GND (Time t58), the gate-to-source capacitance Cgs of the drive transistor MN51 begins to be discharged, and the gate-to-source voltage Vgs of the drive transistor MN51 begins to fall again (Time t58) and is stabilized at the voltage corresponding to an L level (Time t59).

Here, during the period since the drive transistor MN51 begins to make a transition from the full ON to OFF until the drive transistor MN51 ends to change from the full ON to OFF (Time t56-Time t58), the ratio of the current flowing through the drive transistor MN51 to the current flowing through the sense transistor Tr51 is not a desired ratio; accordingly, it is difficult for the current detector unit 52 to detect the current with sufficient accuracy.

Subsequently, the current flowing through the drive transistor MN51 becomes 0, however, the regenerative current generated by the inductor of the load Ld1 flows through the body diode formed between the drain and the source of the drive transistor MN52; accordingly, the voltage Vo of the external output terminal OUT falls from the reference voltage GND further to a lower value by the voltage drop of the body diode (Time t58-Time t60).

Subsequently, in the state where the pulse signal HS is at an L level, the pulse signal LS changes from an L level to an H level (Time t60). Accordingly, the drive transistor MN52 changes from OFF to ON, and the voltage Vo of the external output terminal OUT indicates the level of the reference voltage GND.

Such operation is repeated in the electronic control unit 50. Then, the controller unit 53 controls the duty ratio of the pulse signals HS and LS based on the detection result by the current detector unit 52. Accordingly, the driving period of the drive transistors MN51 and MN52 is adjusted.

As explained above, in the electronic control unit 50, in the period after the drive transistor MN51 changes from OFF to ON until immediately before the drive transistor MN51 becomes full ON (Time t53-Time t55), and in the period after the drive transistor MN51 begins to make a transition from the full ON to OFF until the drive transistor MN51 ends to change from the full ON to OFF (Time t56-Time t58), it is difficult for the current detector unit 52 to perform the current detection with sufficient accuracy. This fact has been a problem.

In the plateau period when the gate-to-source voltage Vgs of the drive transistor MN51 indicates a constant value (for example, Time t53-Time t54, Time t57-Time t58), the slew rate of the rising edge and the falling edge of the voltage Vo is limited to a moderate value, in order to prevent electromagnetic radiation noises from occurring due to sharp changes of the rising and falling edge of the voltage Vo of the external output terminal OUT. When the load Ld1 is the solenoid valve 106 in particular, the load Ld1 and the electronic control unit 50 are distant, and a wiring that couples the load Ld1 and the electronic control unit 50 acts as an antenna and tends to radiate noises. Therefore, the measures to limit the slew rate are indispensable. Therefore, it is practically difficult to shorten the plateau period.

Consequently, an electronic control unit 1 according to Embodiment 1 has been devised, with the improved accuracy of the current detection by the current detector unit, by shortening the periods other than the plateau period where the gate-to-source voltage Vgs of the drive transistor indicates a constant value, among the transition periods from ON to OFF and from OFF to ON of the drive transistor, that is, by shortening the period where it is difficult to perform the current detection with sufficient accuracy.

(An Electronic Control Unit 1 According to Embodiment 1)

Figure 2:
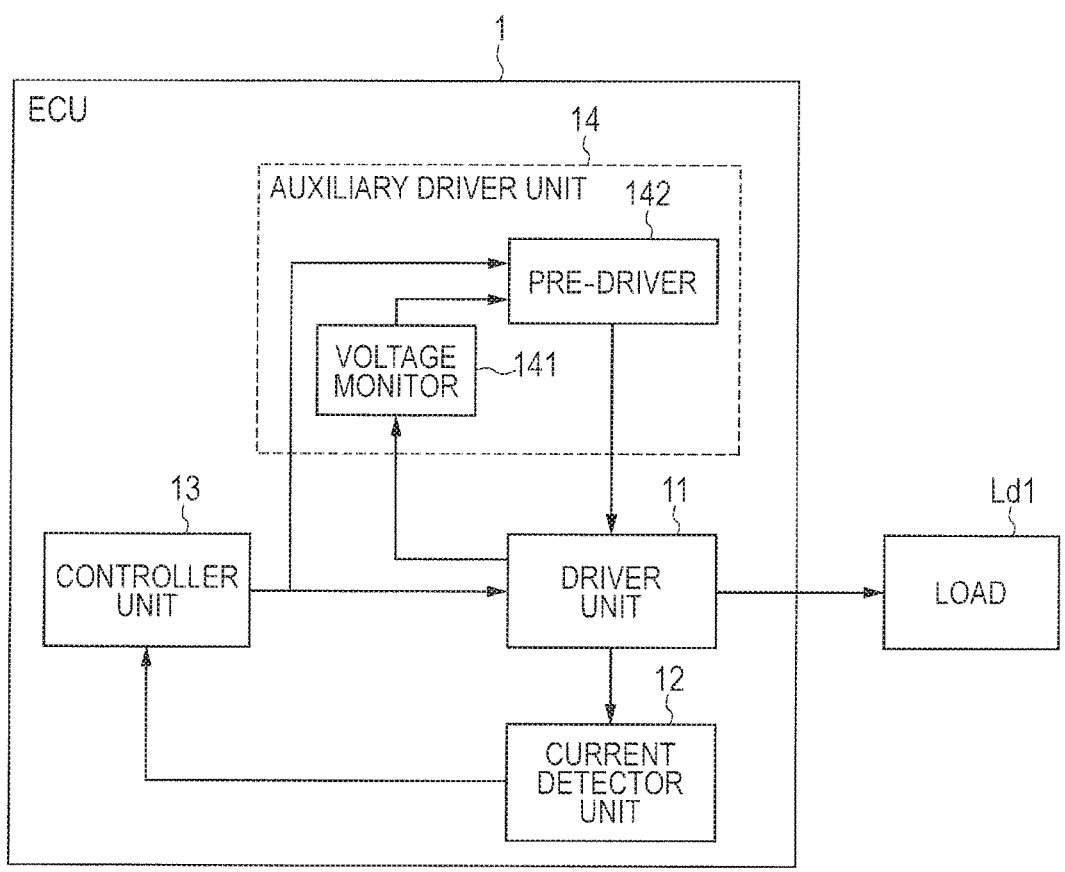
FIG. 2 is a block diagram illustrating an example of the configuration of the electronic control unit according to Embodiment 1.

FIG. 2 is a block diagram illustrating an example of the configuration of an electronic control unit (semiconductor device) 1 according to Embodiment 1. FIG. 2 also illustrates a load Ld1 of which the supply of a current is controlled by the electronic control unit 1.

As illustrated in FIG. 2, the electronic control unit 1 includes a driver unit 11 that drives the load Ld1; a current detector unit 12 that detects the output current of the driver unit 11; a controller unit 13 that controls the drive of the load Ld1 by the driver unit 11 based on the detection result of the current detector unit 12; and an auxiliary driver unit 14 that assists the drive of the load Ld1 by the driver unit 11. The auxiliary driver unit 14 includes a voltage monitor 141 and a pre-driver 142.

Figure 3:
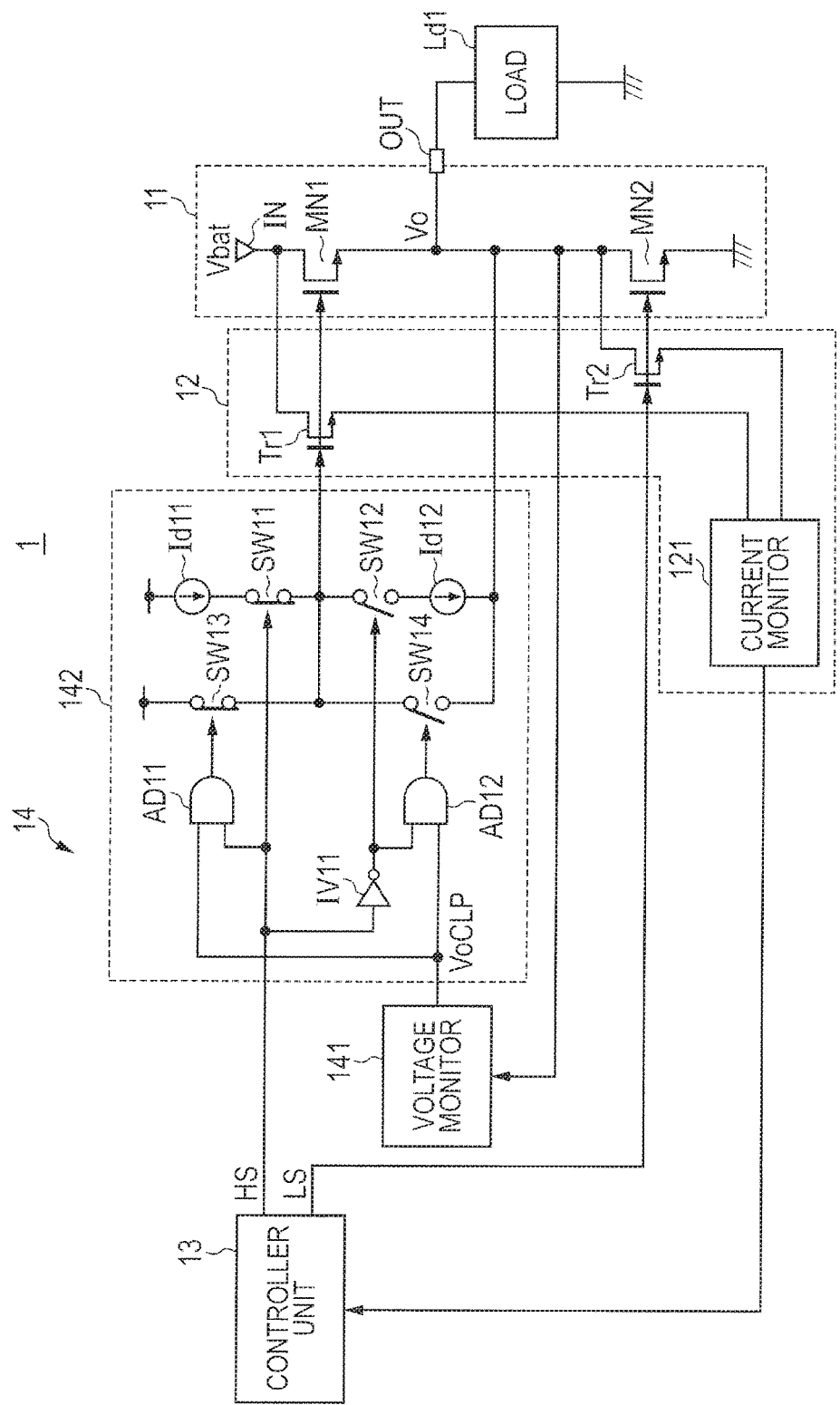
FIG. 3 is a drawing illustrating a concrete example of the configuration of the electronic control unit illustrated in FIG. 2.

FIG. 3 illustrates a concrete example of the configuration of the electronic control unit 1 illustrated in FIG. 2. As illustrated in FIG. 3, in the electronic control unit 1, the driver unit 11 includes a drive transistor MN1 and a drive transistor MN2, and the current detector unit 12 includes a sense transistor Tr1, a sense transistor Tr2, and a current monitor 121. The pre-driver 142 provided in the auxiliary driver unit 14 includes constant current sources Id11 and Id12; switching elements SW11 and SW12; switching elements SW13 and SW14; logical product circuits (hereinafter called AND circuits) AD11 and AD12; and an inverter IV11. The constant current sources Id11 and Id12 and the switching elements SW11 and SW12 configure a first switching unit. The switching elements SW13 and SW14 configure a second switching unit.

The drive transistor MN1 is an N-channel MOS transistor of a high withstand voltage, for example, and is used as a high-potential-side driver. Specifically, the drive transistor MN1 controls the current flowing through a path between the voltage supplying terminal IN supplied with the battery voltage and the external output terminal OUT coupled to the load Ld1, based on the pulse signal HS outputted from the controller unit 13.

The drive transistor MN2 is an N-channel MOS transistor of a high withstand voltage, for example, and is used as a low-potential-side driver. Specifically, the drive transistor MN2 controls the current flowing through a path between the external output terminal OUT and the reference voltage terminal (hereinafter called a reference voltage terminal GND) supplied with a reference voltage GND such as the ground voltage, based on the pulse signal LS outputted from the controller unit 13.

The load Ld1 is a solenoid valve 106 including an inductor, for example, and converts the current supplied by the driver unit 11 into electromagnetic force. The solenoid valve 106 controls oil pressure using the electromagnetic force, and, thereby, controls the opening and closing of the clutch 102. Here, the load Ld1 is provided between the external output terminal OUT of the electronic control unit 1 and the reference voltage terminal GND. Therefore, in the present example, the drive transistor MN1 as the high-potential-side driver is used for driving the load Ld1, and the drive transistor MN2 as the low-potential-side driver is used for discharging the regenerative current of the load Ld1.

The sense transistor Tr1 is formed by an N-channel MOS transistor of a high withstand voltage as well as the drive transistor MN1. For example, the transistor size of the sense transistor Tr51 is $1/1000$ time the transistor size of the drive transistor MN51.

Specifically, as for the sense transistor Tr1, the drain is coupled to the voltage supplying terminal IN, the source is coupled to the current monitor 121, and the gate is supplied with the pulse signal HS. Therefore, a current proportional to (specifically $1/1000$ time as much) the current flowing through a channel between the source and the drain of the drive transistor MN1 flows through a channel between the source and the drain of the sense transistor Tr1.

The sense transistor Tr2 is formed by an N-channel MOS transistor of a high withstand voltage as well as the drive transistor MN2. For example, the transistor size of the sense transistor Tr2 is $1/1000$ time the transistor size of the drive transistor MN2.

Specifically, as for the sense transistor Tr2, the drain is coupled to the external output terminal OUT, the source is coupled to the current monitor 121, and the gate is supplied with the pulse signal LS. Therefore, a current proportional to (specifically $1/1000$ time as much) the current flowing through a channel between the source and the drain of the drive transistor MN2 flows through a channel between the source and the drain of the sense transistor Tr2.

The current monitor 121 monitors the current flowing through each of the sense transistors Tr1 and Tr2. The monitored result by the current monitor 121 is outputted as a detection result of the current detector unit 12.

The controller unit 13 drives the drive transistors MN1 and MN2 alternately using the pulse signals HS and LS. Here, the controller unit 13 controls the duty ratio of the pulse signals HS and LS based on the detection result by the current detector unit 12. Accordingly, the driving period of the drive transistors MN1 and MN2 is adjusted.

The voltage monitor 141 monitors the voltage Vo of the external output terminal OUT.

(A First Concrete Example of the Configuration of the Voltage Monitor 141)

Figure 4:
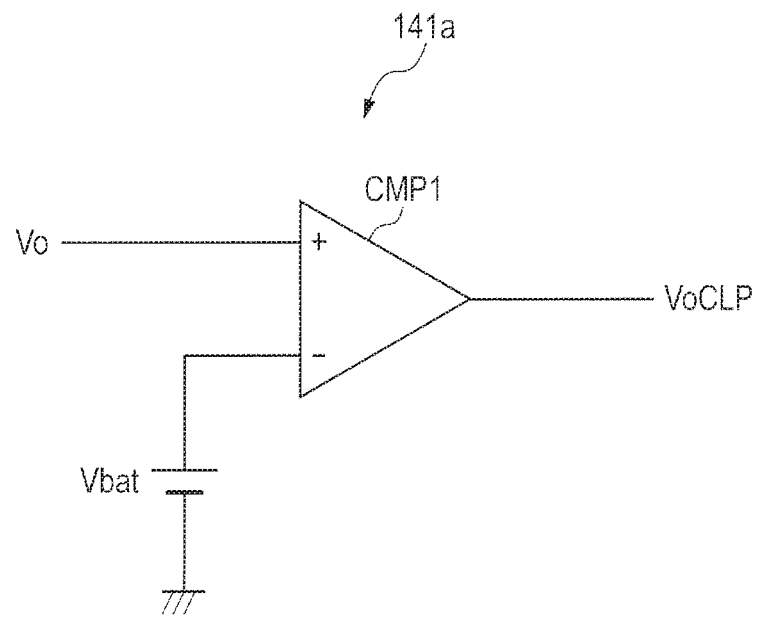
FIG. 4 is a drawing illustrating a first concrete example of the configuration of the voltage monitor.

FIG. 4 illustrates a first concrete example of the configuration of the voltage monitor 141 as a voltage monitor 141a. As illustrated in FIG. 4, the voltage monitor 141a includes a comparator CMP1.

The comparator CMP1 compares the voltage Vo of the external output terminal OUT and the battery voltage Vbat and outputs the comparison result as a monitored result VoCLP. For example, the comparator CMP1 outputs the monitored result VoCLP of an L level when the voltage Vo of the external output terminal OUT is less than the battery voltage Vbat, and outputs the monitored result VoCLP of an H level when the voltage Vo of the external output terminal OUT has reached the battery voltage Vbat.

The present embodiment explains as an example the case where the comparator CMP1 compares the voltage Vo of the external output terminal OUT with the battery voltage Vbat, however, the comparison is not restricted to the present example. The comparator CMP1 may compare the voltage Vo of the external output terminal OUT with an arbitrary prescribed voltage lower than the battery voltage Vbat. The comparator CMP1 may have a hysteresis characteristic. Accordingly, it is possible to suppress a variation of the monitored result VoCLP due to chattering.

(A Second Concrete Example of the Configuration of the Voltage Monitor 141)

Figure 5:
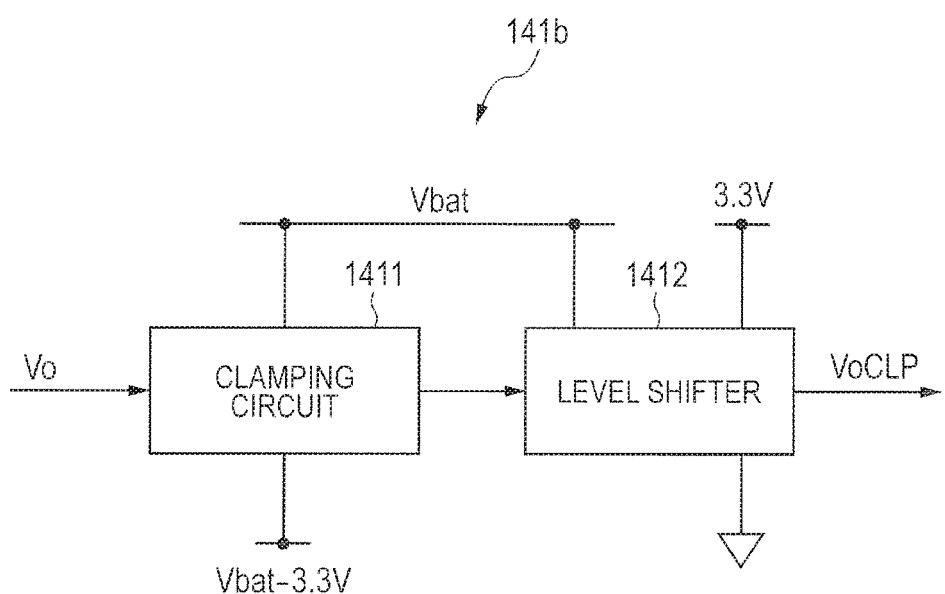
FIG. 5 is a drawing illustrating a second concrete example of the configuration of the voltage monitor.
Figure 6:
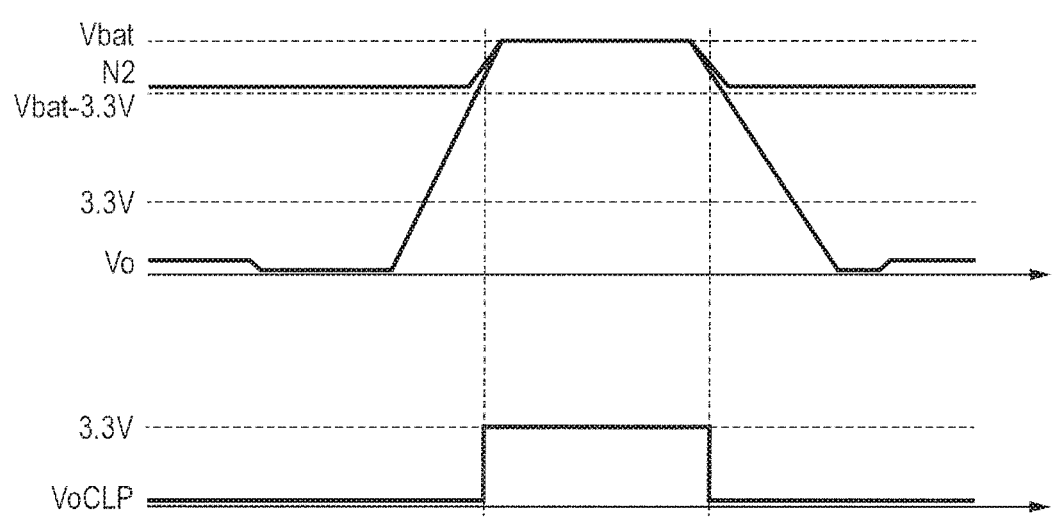
FIG. 6 is a timing chart illustrating operation of a voltage monitor illustrated in FIG. 5.

FIG. 5 illustrates a second concrete example of the configuration of the voltage monitor 141 as a voltage monitor 141b. FIG. 6 is a timing chart illustrating the operation of the voltage monitor 141b.

The voltage monitor 141b includes a clamping circuit 1411 and a level shifter 1412. The clamping circuit 1411 clamps the voltage Vo of the external output terminal OUT that is equal to or less than a clamp voltage to the clamp voltage. Specifically, the clamping circuit 1411 clamps the voltage Vo that is equal to or less than a voltage lower than the battery voltage Vbat by the power supply voltage VDD (=3.3 V) (that is, Vbat−3.3 V) to Vbat−3.3 V. The level shifter 1412 level-shifts the output voltage of the clamping circuit 1411 to one of the levels of the reference voltage GND and the power supply voltage VDD (=3.3 V), and outputs the level-shifted voltage as the monitored result VoCLP.

Returning to FIG. 3, the explanation is continued.

In the pre-driver 142, the constant current source Id11 and the switching element SW11 are provided in series between the power supply voltage terminal supplied with the power supply voltage VDD (hereinafter called a power supply voltage terminal VDD) and a gate of the drive transistor MN1. The switching element SW11 switches ON and OFF based on the pulse signal HS. The constant current source Id12 and the switching element SW12 are provided in series between the gate of the drive transistor MN1 and the source of the drive transistor MN1 (the external output terminal OUT). The switching element SW12 switches ON and OFF based on a signal obtained by inverting the pulse signal HS by the inverter IV11.

For example, when the pulse signal HS is at an H level, the switching element SW11 switches to ON and the switching element SW12 switches to OFF, and charges are stored to the gate of the drive transistor MN1 from the constant current source Id11 via the switching element SW11. Accordingly, the drive transistor MN1 changes from OFF to ON. On the other hand, when the pulse signal HS is at an L level, the switching element SW11 switches to OFF and the switching element SW12 switches to ON, and the charges stored in the gate of the drive transistor MN1 are discharged to the external output terminal OUT via the switching element SW12 and the constant current source Id12. Accordingly, the drive transistor MN1 changes from ON to OFF.

The AND circuit AD11 outputs the logical product of the monitored result VoCLP and the pulse signal HS. The AND circuit AD12 outputs the logical product of the monitored result VoCLP and an inverted signal of the pulse signal HS. The switching element SW13 is provided between the power supply voltage terminal VDD and the gate of the drive transistor MN1 and switches ON and OFF based on the output of the AND circuit AD11. The switching element SW14 is provided between the gate of the drive transistor MN1 and the source of the drive transistor MN1 (the external output terminal OUT), and switches ON and OFF based on the output of the AND circuit AD12.

For example, when the voltage Vo of the external output terminal OUT is less than the battery voltage Vbat, the monitored result VoCLP of an L level is outputted from the voltage monitor 141, and the AND circuits AD11 and AD12 output a signal of an L level irrespective of the pulse signal HS. Accordingly, each of the switching elements SW13 and SW14 switches to OFF. At this time, the charge and discharge for the gate of the drive transistor MN1 by the second switching unit does not take place.

As opposed to this, when the voltage Vo of the external output terminal OUT has reached the battery voltage Vbat, the monitored result VoCLP of an H level is outputted from the voltage monitor 141, and the AND circuits AD11 and AD12 output respectively the pulse signal HS and its inverted signal as they are.

Specifically, in the case where the voltage Vo of the external output terminal OUT has reached the battery voltage Vbat, when the pulse signal HS is at an H level, the AND circuit AD11 outputs a signal of an H level, and the AND circuit AD12 outputs a signal of an L level. Accordingly, the switching element SW13 switches to ON and the switching element SW14 switches to OFF, and charges are stored to the gate of the drive transistor MN1 via the switching element SW13 at the charge and discharge speed faster than that via the switching element SW11. Accordingly, the drive transistor MN1 switches from OFF to ON quickly.

On the other hand, in the case where the voltage Vo of the external output terminal OUT has reached the battery voltage Vbat, when the pulse signal HS is at an L level, the AND circuit AD11 outputs a signal of an L level, and the AND circuit AD12 outputs a signal of an H level. Accordingly, the switching element SW13 switches to OFF and the switching element SW14 switches to ON, and the charges stored in the gate of the drive transistor MN1 are discharged to the external output terminal OUT via the switching element SW14, at the charge and discharge speed faster than that via the switching element SW12. Accordingly, the drive transistor MN1 switches from ON to OFF quickly.

(Operation of the Electronic Control Unit 1)

Figure 7:
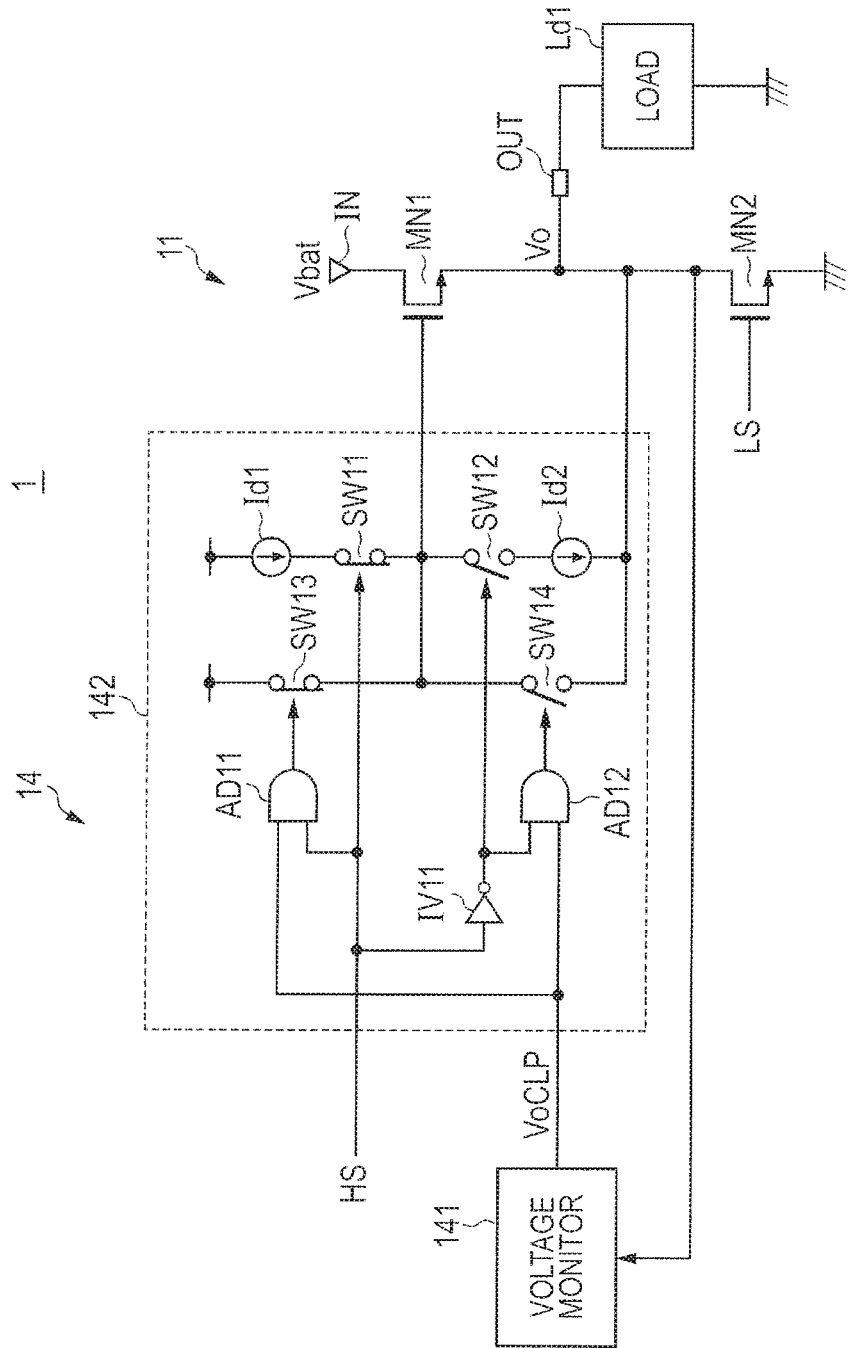
FIG. 7 is a drawing illustrating a driver unit and an auxiliary driver unit among the components of the electronic control unit illustrated in FIG. 3.
Figure 8:
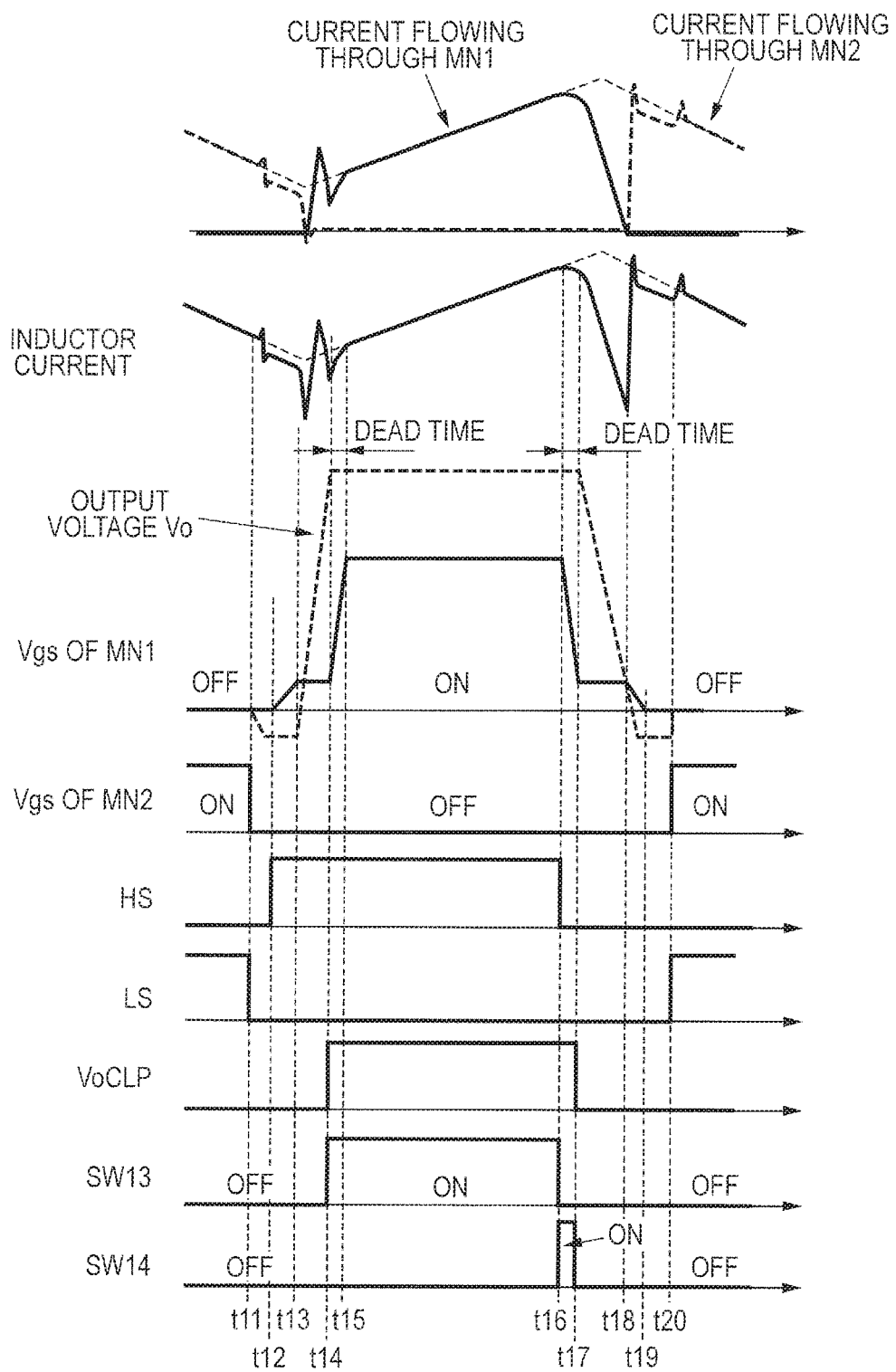
FIG. 8 is a timing chart illustrating operation of the electronic control unit illustrated in FIG. 3.

Next, the operation of the electronic control unit 1 is explained with reference to FIGS. 7 and 8. FIG. 7 illustrates the driver unit 11 and the auxiliary driver unit 14 among the components of the electronic control unit 1 illustrated in FIG. 3. FIG. 8 is a timing chart illustrating the operation of the electronic control unit 1.

First, in the state where the pulse signal HS is at an L level, the pulse signal LS changes from an H level to an L level (Time t11). Accordingly, the gate-to-source voltage Vgs of the drive transistor MN2 becomes less than the threshold voltage Vth, and the drive transistor MN2 changes from ON to OFF (Time t11). At this time, although the drive transistor MN2 switches to OFF, a regenerative current generated by the inductor of the load Ld1 flows through the body diode formed between the drain and the source of the drive transistor MN2, and the voltage Vo of the external output terminal OUT further falls to a value lower than the reference voltage GND by the voltage drop of the body diode.

Subsequently, in the state where the pulse signal LS is at an L level, the pulse signal HS changes from an L level to an H level (Time t12). Accordingly, the gate-to-source voltage Vgs of the drive transistor MN1 begins to rise (Time t12). Subsequently, when the gate-to-source voltage Vgs of the drive transistor MN1 rises to the threshold voltage Vth, the drive transistor MN1 changes from OFF to ON (Time t13). Accordingly, the path of the current flowing through the load Ld1 changes from the path via the drive transistor MN2 to the path via the drive transistor MN1. At this time, the current does not flow toward the drive transistor MN2 and the current detected by the sense transistor Tr2 becomes 0. As opposed to this, the current flowing through the drive transistor MN1 begins to rise and the current detected by the sense transistor Tr1 begins to rise.

When the drive transistor MN1 changes from OFF to ON, the voltage Vo of the external output terminal OUT begins to rise towards the battery voltage Vbat (Time t13). Here, during the period until the voltage Vo reaches the battery voltage Vbat (Time t13-Time t14), the gate-to-source capacitance Cgs of the drive transistor MN1 does not change apparently. Therefore, the gate-to-source voltage Vgs of the drive transistor MN1 hardly changes (Time t13-Time t14). Subsequently, when the voltage Vo reaches the battery voltage Vbat (Time t14), the gate-to-source capacitance Cgs of the drive transistor MN1 begins to be charged, and the gate-to-source voltage Vgs of the drive transistor MN1 begins to rise again (Time t14), and is stabilized at the upper limit voltage corresponding to the H level (Time t15).

Here, in the period after the drive transistor MN1 changes from OFF to ON until immediately before the drive transistor MN1 becomes full ON (Time t13-Time t15), the ratio of the current flowing through each of the drive transistor MN1 and the sense transistor Tr1 is not a desired ratio; accordingly, it is difficult for the current detector unit 12 to detect the current with sufficient accuracy.

However, during the present period, in the first plateau period (Time t13-Time t14) where the gate-to-source voltage Vgs of the drive transistor MN1 indicates a constant value, the slew rate of the rising edge of the voltage Vo is limited to a moderate value, in order to prevent electromagnetic radiation noises from occurring due to the rising edge change of the voltage Vo. Therefore, it is difficult to shorten the first plateau period. As opposed to this, in the period after the first plateau period ends until the drive transistor MN1 becomes full ON and the second plateau period starts (Time t14-Time t15), the voltage Vo is the battery voltage Vbat and stable; accordingly, it is not necessary to take into consideration the restriction of the slew rate of the voltage Vo. Therefore, in the present embodiment, by shortening the period between the first plateau period and the second plateau period (Time t14-Time t15), the period when the current detection cannot be performed with sufficient accuracy is shortened.

Specifically, during the period (Time t14-Time t17) over which the voltage monitor 141 outputs the monitored result VoCLP of an H level as the consequence of the voltage Vo having reached the battery voltage Vbat, in the period (Time t14-Time t16) when the pulse signal HS indicates an H level, the switching element SW13 is switched to ON and the switching element SW14 is switched to OFF in the second switching unit. Accordingly, charges are stored to the gate of the drive transistor MN1, at a charge speed faster than that in the case of using the first switching unit, and the gate-to-source voltage Vgs of the drive transistor MN1 rises quickly (Time t14-Time t15). Accordingly, the period between the first plateau period and the second plateau period (Time t14-Time t15) is shortened, and the period when the current detection cannot be performed with suffi-cient accuracy is shortened. Consequently, it is possible for the current detector unit 12 to improve the current detection accuracy.

Subsequently, when an prescribed period passes, in the state where the pulse signal LS is at an L level, the pulse signal HS changes from an H level to an L level (Time t16). Accordingly, the gate-to-source capacitance Cgs of the drive transistor MN1 begins to be discharged, and the gate-to-source voltage Vgs of the drive transistor MN1 begins to fall (Time t16). Subsequently, when the gate-to-source voltage Vgs of the drive transistor MN1 becomes less than the threshold voltage Vth, the drive transistor MN1 changes from ON to OFF (Time t17). Accordingly, the voltage Vo begins to fall (Time t17). Here, during the period until the voltage Vo falls to the reference voltage GND (Time t17-Time t18), the gate-to-source capacitance Cgs of the drive transistor MN1 does not change apparently. Therefore, the gate-to-source voltage Vgs of the drive transistor MN1 hardly changes. Subsequently, when the voltage Vo reaches the reference voltage GND (Time t18), the gate-to-source capacitance Cgs of the drive transistor MN1 begins to be discharged, and the gate-to-source voltage Vgs of the drive transistor MN1 begins to fall again (Time t18) and is stabilized at the voltage corresponding to the L level (Time t19).

Here, in the period (Time t16-Time t18) since the drive transistor MN1 begins to make a transition from the full ON to OFF until the drive transistor MN1 ends to change from the full ON to OFF, the ratio of the current flowing through each of the drive transistor MN1 and the sense transistor Tr1 is not a desired ratio; accordingly, it is difficult for the current detector unit 12 to perform current detection with sufficient accuracy.

However, during the present period, in the third plateau period (Time t17-Time t18) where the gate-to-source voltage Vgs of the drive transistor MN1 indicates a constant value, the slew rate of the falling edge of the voltage Vo is limited to a moderate value, in order to prevent the electromagnetic radiation noise from occurring due to the falling edge change of the voltage Vo. Therefore, it is difficult to shorten the third plateau period. As opposed to this, in the period after the end of the second plateau period until the start of the third plateau period (Time t16-Time t17), the voltage Vo is the battery voltage Vbat and stable; accordingly, it is not necessary to take into consideration the restriction of the slew rate of the voltage Vo. Therefore, in the present embodiment, by shortening the period between the second plateau period and the third plateau period (Time t16-Time t17), the period when the current detection cannot be performed with sufficient accuracy is shortened.

Specifically, during the period (Times t14-t17) over which the voltage monitor 141 outputs the monitored result VoCLP of an H level as the consequence of the voltage Vo having reached the battery voltage Vbat, in the period (Time t16-Time t17) when the pulse signal HS indicates an L level, the switching element SW13 is switched to OFF and the switching element SW14 is switched to ON in the second switching unit. Accordingly, the charge stored in the gate of the drive transistor MN1 is discharged at a discharge speed faster than that in the case of using the first switching unit. Accordingly, the gate-to-source voltage Vgs of the drive transistor MN1 falls quickly (Time t16-Time t17). Accordingly, the period (Time t16-Time t17) between the second plateau period and the third plateau period is shortened, and the period when the current detection cannot be performed with sufficient accuracy is shortened. Consequently, it is possible for the current detector unit 12 to improve the current detection accuracy.

Subsequently, the current flowing through the drive transistor MN1 becomes 0. However, the regenerative current generated by the inductor of the load Ld1 flows through the body diode formed between the drain and the source of the drive transistor MN2; accordingly, the voltage Vo of the external output terminal OUT further falls to a value lower than the reference voltage GND by the voltage drop of the body diode (Time t18-Time t20).

Subsequently, in the state where the pulse signal HS is at an L level, the pulse signal LS changes from an L level to an H level (Time t20). Accordingly, the drive transistor MN2 changes from OFF to ON, and the voltage Vo of the external output terminal OUT indicates the level of the reference voltage GND.

Such operation is repeated in the electronic control unit 1. Then, the controller unit 13 controls the duty ratio of the pulse signals HS and LS based on the detection result by the current detector unit 12. Accordingly, the driving period of the drive transistors MN1 and MN2 is adjusted.

In this way, the electronic control unit 1 according to the present embodiment can improve the current detection accuracy by the current detector unit 12, by shortening the period other than the plateau period where the gate-to-source voltage Vgs of the drive transistor MN1 indicates a constant value, among the transition periods from OFF to ON and from ON to OFF of the drive transistor MN1, that is, by shortening the period where the current detection cannot be performed with sufficient accuracy.

(A First Modified Example of the Electronic Control Unit 1)

Figure 9:
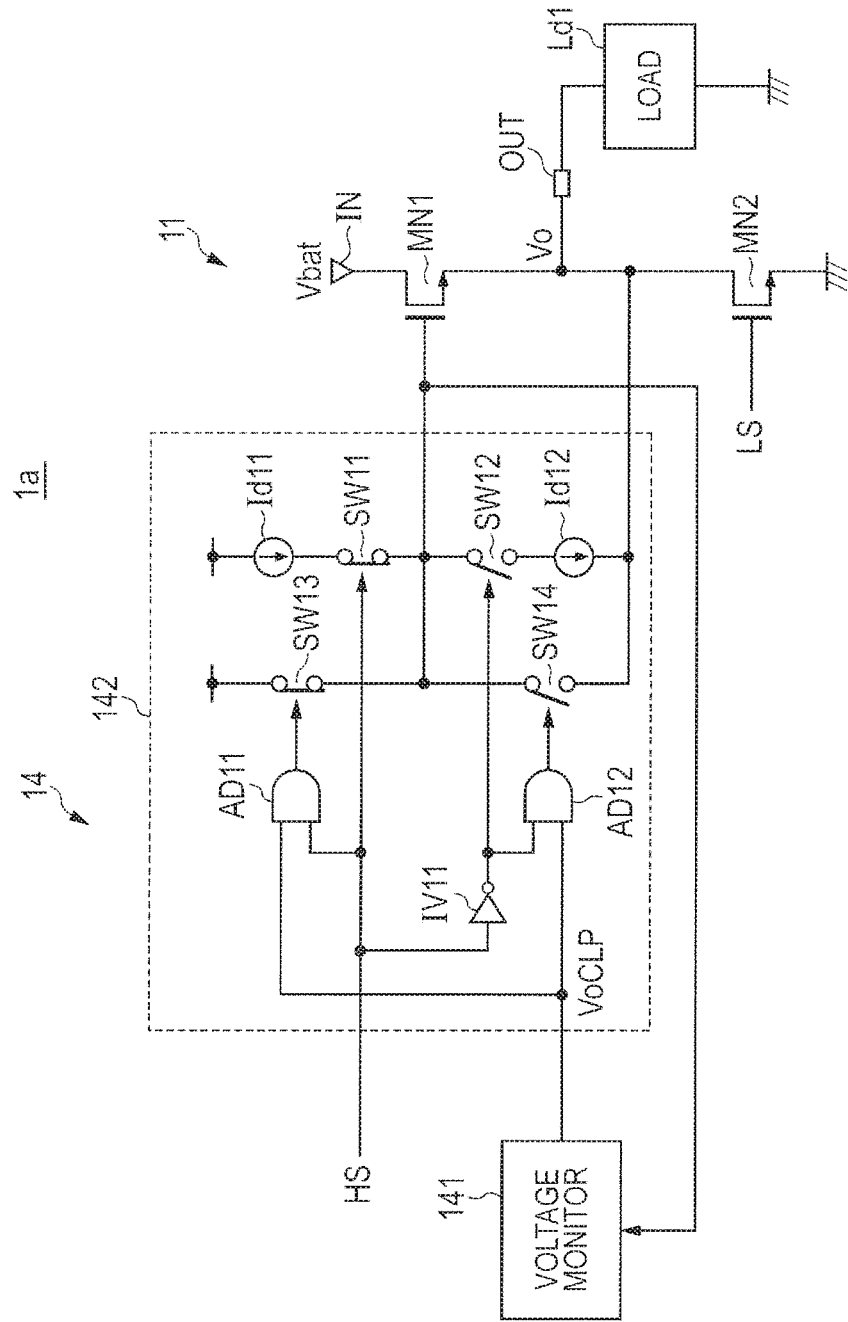
FIG. 9 is a drawing illustrating a first modified example of the electronic control unit according to Embodiment 1.

FIG. 9 illustrates a first modified example of the electronic control unit 1 as an electronic control unit 1a. FIG. 9 illustrates only the driver unit 11 and the auxiliary driver unit 14 among the components of the electronic control unit 1a. FIG. 9 also illustrates the load Ld1 of which the supply of a current is controlled by the electronic control unit 1a.

As illustrated in FIG. 9, when compared with the electronic control unit 1, in the electronic control unit 1a, the voltage monitor 141 monitors the gate voltage of the drive transistor MN1 instead of the voltage Vo of the external output terminal OUT. Accordingly, the voltage monitor 141 can monitor the voltage Vo of the external output terminal OUT indirectly. The other configurations of the electronic control unit 1a are the same as those of the electronic control unit 1; accordingly, the explanation thereof is omitted.

Figure 10:
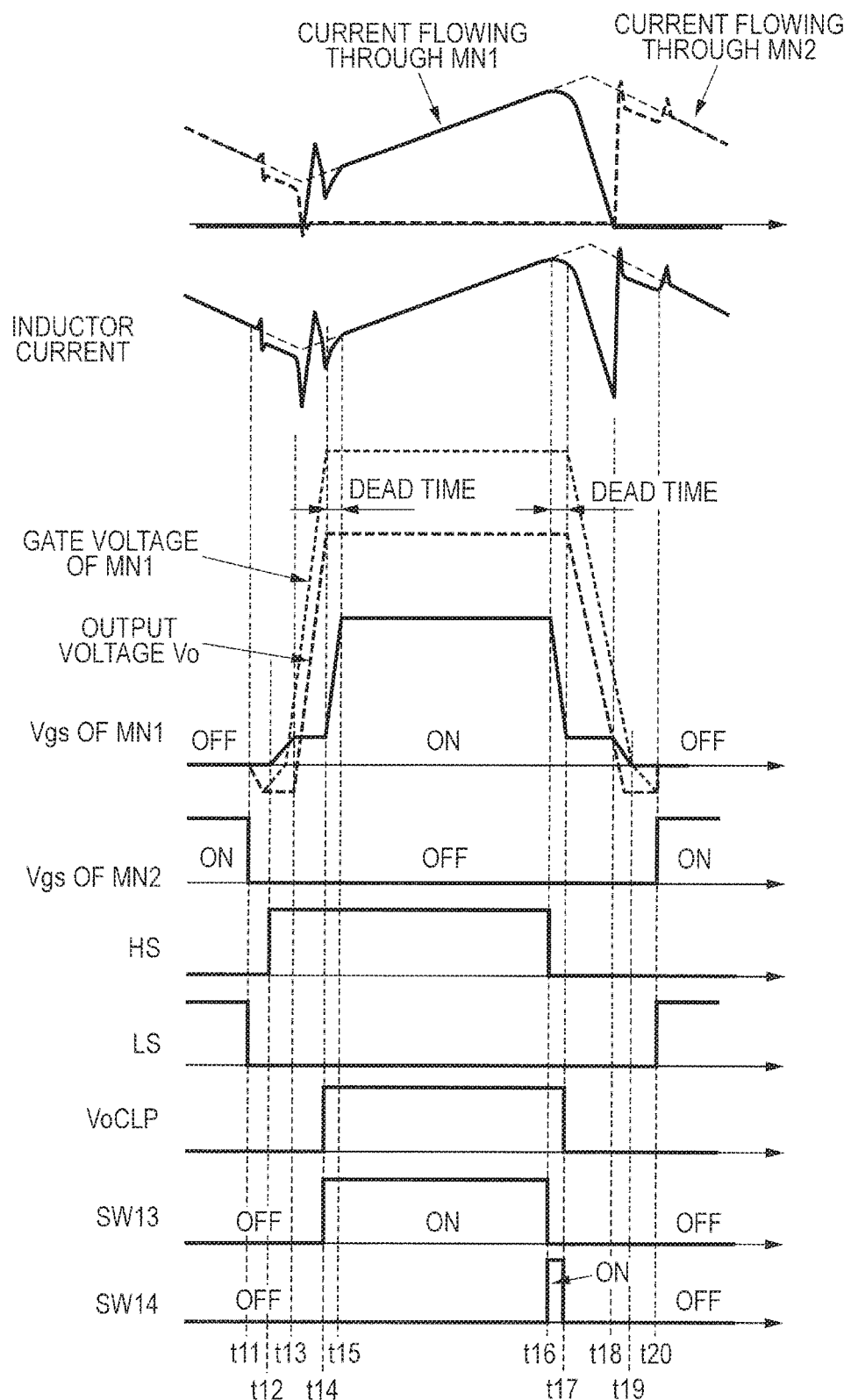
FIG. 10 is a timing chart illustrating operation of the electronic control unit illustrated in FIG. 9.

FIG. 10 is a timing chart illustrating the operation of the electronic control unit 1a. As illustrated in FIG. 10, when the voltage Vo of the external output terminal OUT has reached the battery voltage Vbat, the gate voltage Vg of the drive transistor MN1 indicates the voltage level that is higher than the voltage Vo by the gate-to-source voltage Vgs. Therefore, for example, when the gate voltage Vg indicates the voltage level that is higher than the voltage Vo by the gate-to-source voltage Vgs, the voltage monitor 141 outputs the monitored result VoCLP of an H level, and in all other cases, the voltage monitor 141 outputs the monitored result VoCLP of an L level.

In this way, the electronic control unit 1a can produce the effect of the same degree as in the electronic control unit 1. Furthermore, in the electronic control unit 1a, the voltage monitor 141 monitors the stable gate voltage Vg of the drive transistor MN1; accordingly, it is possible to monitor the more exact voltage Vo indirectly, without being subject to the influence of ringing that the voltage Vo of the external output terminal OUT receives.

(A Second Modified Example of the Electronic Control Unit 1)

Figure 11:
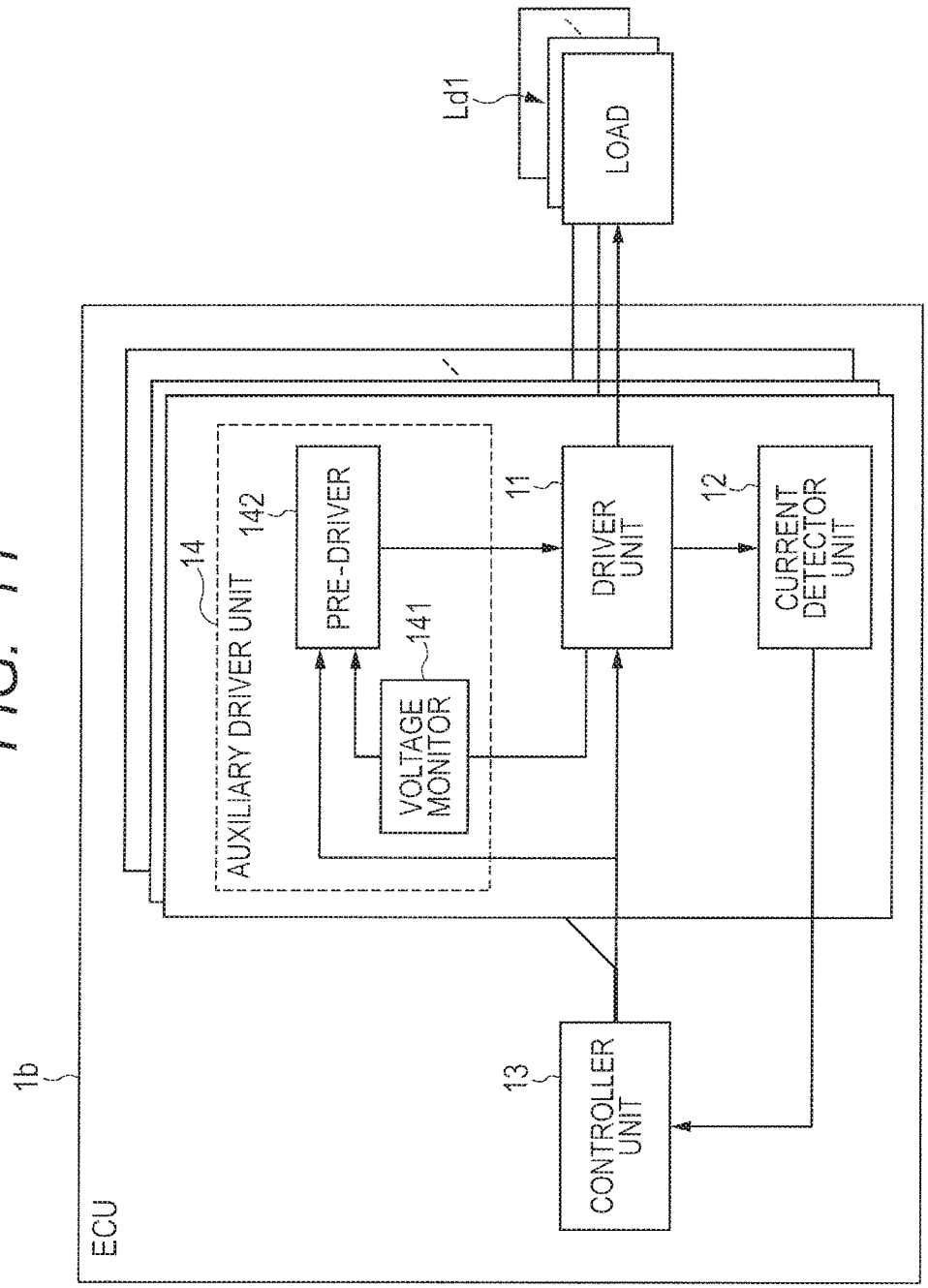
FIG. 11 is a block diagram illustrating a second modified example of the electronic control unit according to Embodiment 1.

FIG. 11 is a block diagram illustrating a second modified example of the electronic control unit 1 as an electronic control unit 1b. FIG. 11 also illustrates multiple loads Ld1 in each of which the supply of a current is controlled by the electronic control unit 1b.

As illustrated in FIG. 11, the electronic control unit 1b includes several groups of the combination of the driver unit 11, the current detector unit 12, and the auxiliary driver unit 14, and the controller unit 13 provided in common for those combination. The electronic control unit 1b drives the multiple loads Ld1. The circuit configuration and the operation of each component are the same as that of the electronic control unit 1; accordingly, the explanation thereof is omitted.

In this way, the electronic control unit 1b can produce the effect of the same degree as in the electronic control unit 1.

Embodiment 2

Figure 12:
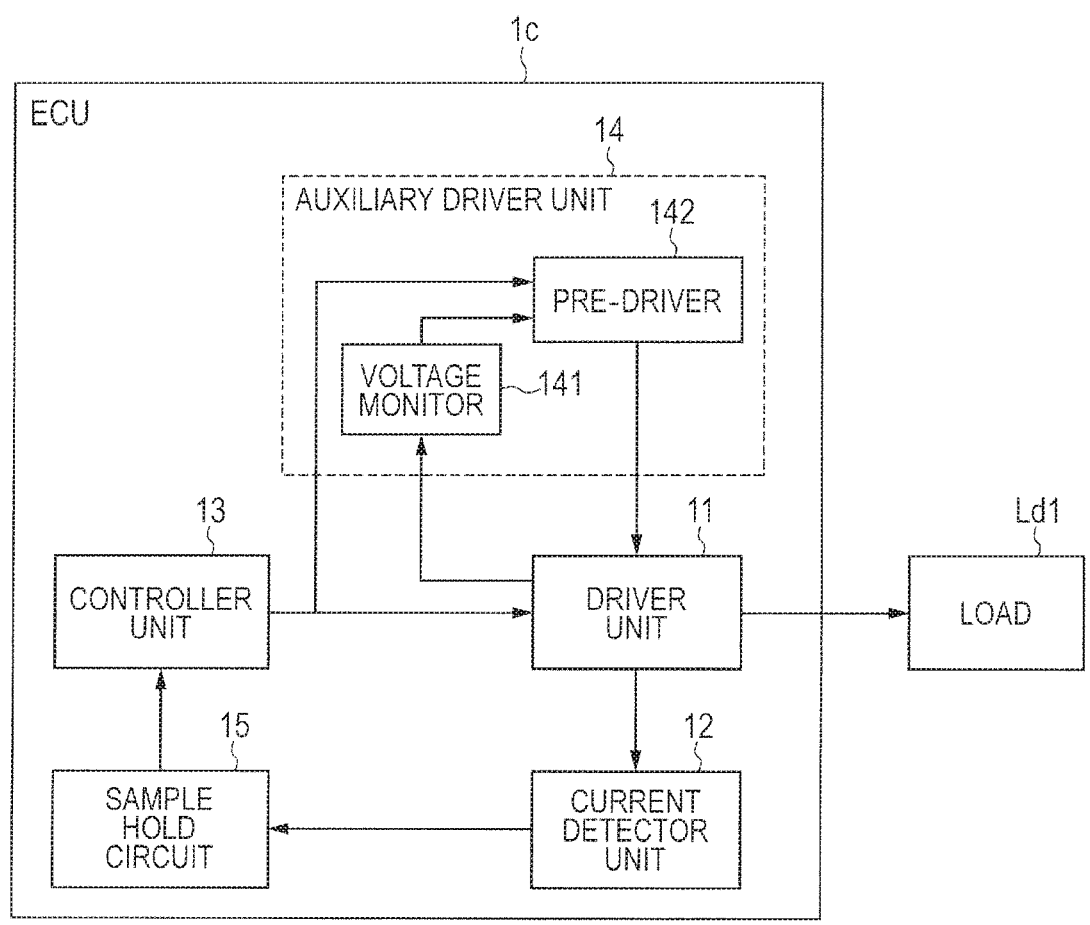
FIG. 12 is a block diagram illustrating an example of the configuration of an electronic control unit according to Embodiment 2.
Figure 13:
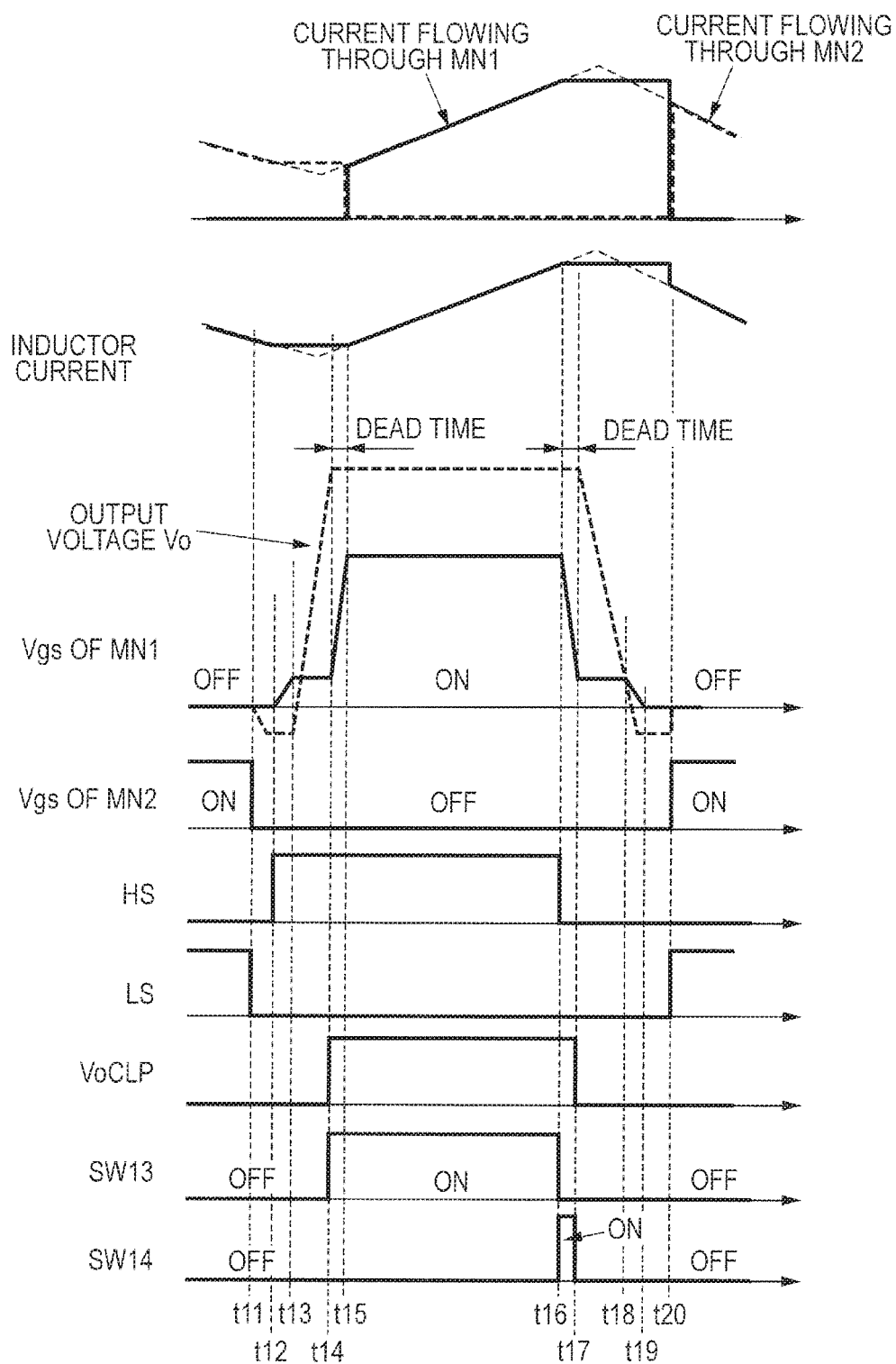
FIG. 13 is a timing chart illustrating operation of the electronic control unit illustrated in FIG. 12.

FIG. 12 is a block diagram illustrating an example of the configuration of an electronic control unit 1c according to Embodiment 2. FIG. 13 is a timing chart illustrating the operation of the electronic control unit 1c.

As illustrated in FIG. 12, the electronic control unit 1c further includes a sample hold circuit 15, when compared with the electronic control unit 1. The other configurations of the electronic control unit 1c are the same as those of the electronic control unit 1; accordingly, the explanation thereof is omitted.

As illustrated in FIG. 13, the sample hold circuit 15 samples the detection current of the current detector unit 12 at the timing of the falling edge of the pulse signal LS, for example, and holds the sampled value for a prescribed period (in the neighborhood of Time t11-Time t15), and samples the detection current of the current detector unit 12 at timing of the falling edge of the pulse signal HS, and holds the sampled value for a prescribed period (in the neighborhood of Time t16-Time t20). The controller unit 13 controls the duty ratio of the pulse signals HS and LS corresponding to the value of the detection current held by the sample hold circuit 15.

Accordingly, it is possible to reduce the current detection error occurring at the timing when the path of the current flowing through the load Ld1 changes from the path of the drive transistor MN1 to the path of the drive transistor MN2.

Embodiment 3

Figure 14:
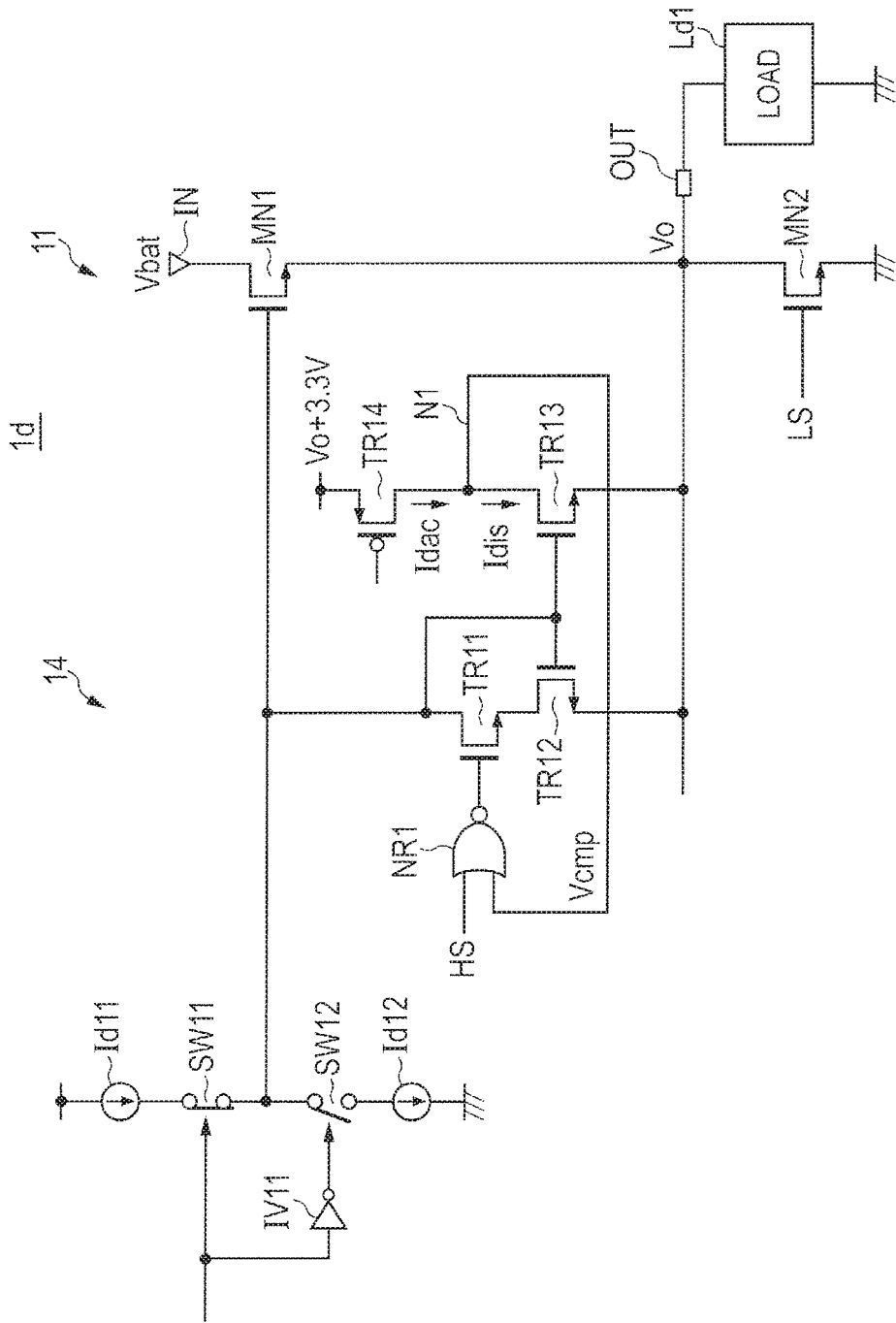
FIG. 14 is a drawing illustrating a part of a concrete example of the configuration of an electronic control unit according to Embodiment 3.

FIG. 14 illustrates a concrete example of the configuration of an electronic control unit 1d according to Embodiment 3. FIG. 14 illustrates only a driver unit 11 and an auxiliary driver unit 14 among the components of the electronic control unit 1d. FIG. 14 also illustrates a load Ld1 of which the supply of a current is controlled by the electronic control unit 1d.

As illustrated in FIG. 14, in the electronic control unit 1d, the pre-driver 142 includes transistors TR11-TR14 and a NOR circuit NR1, instead of the AND circuits AD11 and, AD12 and the switching elements SW13 and SW14. Among the components, the transistors TR12-TR14 also serve as the voltage monitor 141.

The transistors TR11 and TR12 are provided in series between the gate of the drive transistor MN1 and the external output terminal OUT. The transistor TR11 switches to ON and OFF based on the output signal of the NOR circuit NR1. The transistors TR12 and TR13 configure a current mirror circuit. Consequently, a current Idis corresponding to the current flowing through the transistor TR12 flows through the transistor TR13. A constant current source Idac flows through the transistor TR14.

For example, when the current Idis is smaller than the current Idac, a voltage Vcmp of a node N1 between the transistors TR13 and TR14 indicates an H level. Accordingly, an output signal of the NOR circuit NR1 indicates an L level, and the transistor TR11 switches to OFF. As opposed to this, when the current Idis is equal to or greater than the current Idac, the voltage Vcmp indicates an L level. Accordingly, the output signal of the NOR circuit NR1 indicate an H level, and the transistor TR11 switches to ON.

Figure 15:
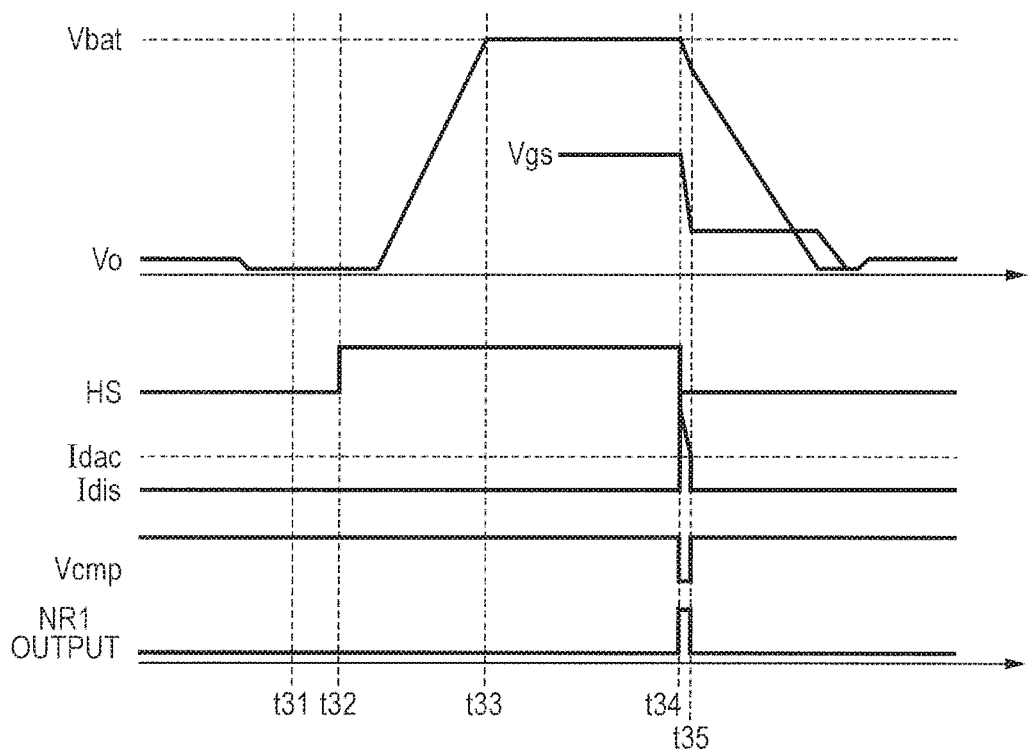
FIG. 15 is a timing chart illustrating operation of the electronic control unit illustrated in FIG. 14.

FIG. 15 is a timing chart illustrating the operation of the electronic control unit 1d. As illustrated in FIG. 15, when the pulse signal HS is at an L level, the switching element SW11 switches to OFF, and the gate voltage Vg of the drive transistor MN1 is maintained at an L level. At this time, the drive transistor MN1 is in an off state, and the voltage Vo of the external output terminal OUT indicates an L level (Time t31). Subsequently, when the pulse signal HS changes from an L level to an H level (Time t32), the switching element SW11 changes from OFF to ON, and the gate voltage of the drive transistor MN1 rises. Accordingly, the drive transistor MN1 switches to ON, and the voltage Vo of the external output terminal OUT rises to the battery voltage Vbat (Time t33). Subsequently, when the pulse signal HS changes from an H level to an L level (Time t34), the switching element SW11 changes from ON to OFF, and the supply of charges to the gate of the drive transistor MN1 stops. At this time, the gate voltage Vg of the drive transistor MN1 indicates an H level; accordingly, the current Idis flowing through the transistor TR13 is larger than the current Idac flowing through the transistor TR14. Therefore, the voltage Vcmp indicates an L level. Accordingly, the output signal of the NOR circuit NR1 becomes at an H level, and the transistor TR11 switches to ON. Consequently, the gate voltage Vg of the drive transistor MN1 falls quickly (Time t34-Time t35). Subsequently, when the current Idis becomes smaller than the current Idac, the voltage Vcmp changes from an L level to an H level, and the output signal of the NOR circuit NR1 changes from an H level to an L level (Time t35). Accordingly, the transistor TR11 switches to OFF, and the rapid fall of the gate voltage Vg of the drive transistor MN1 stops (Time t35).

Other operations of the electronic control unit 1d are the same as those of the electronic control unit 1; therefore, the explanation thereof is omitted.

The electronic control unit 1d can produce the effect of the same degree as in the electronic control unit 1. Furthermore, the electronic control unit 1d can realize the voltage monitor 141 in a simple circuit configuration; accordingly, it is possible to suppress the increase of the circuit scale.

Embodiment 4

Figure 16:
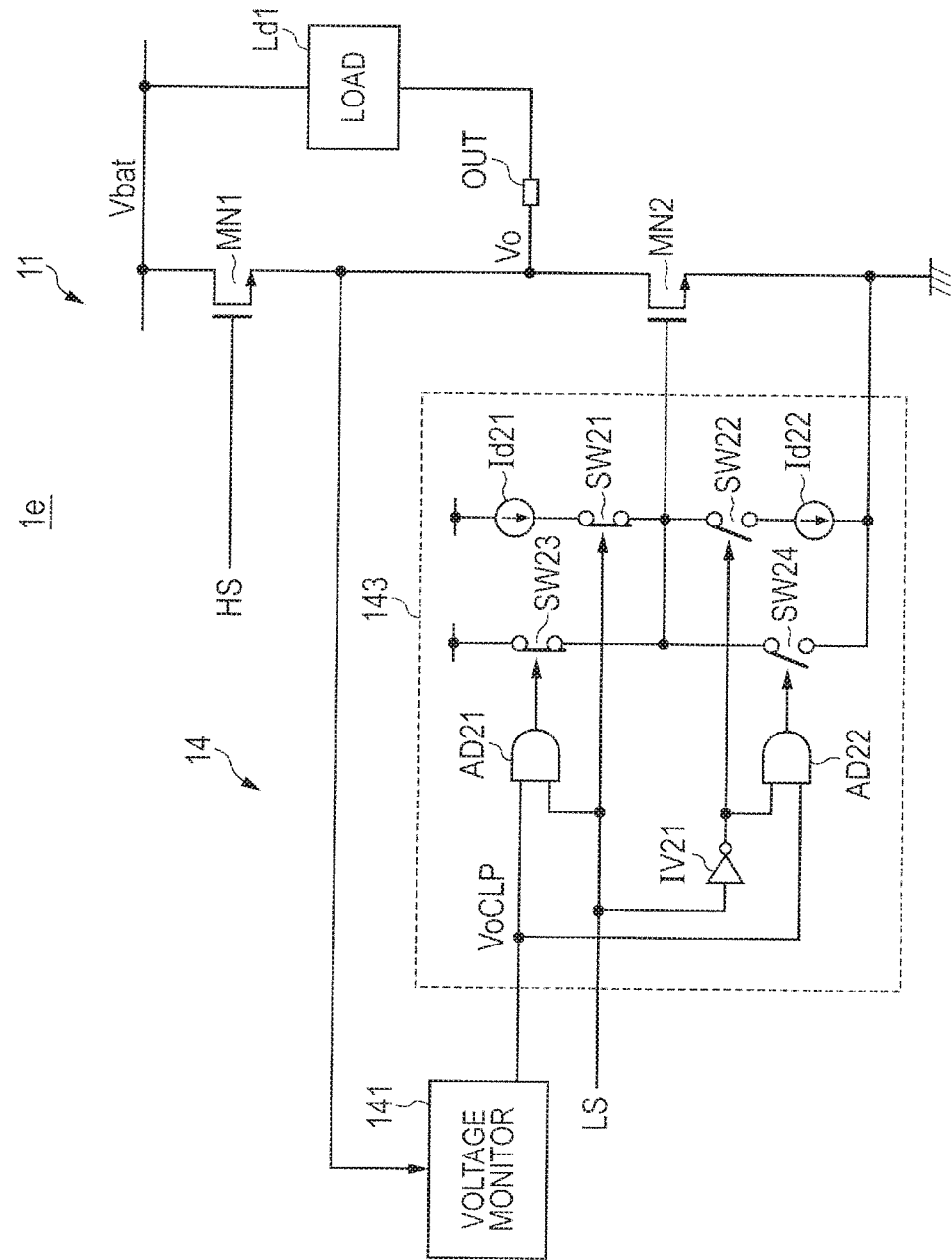
FIG. 16 is a drawing illustrating a part of a concrete example of the configuration of an electronic control unit according to Embodiment 4.

FIG. 16 is a drawing illustrating a concrete example of the configuration of an electronic control unit 1e according to Embodiment 4. FIG. 16 illustrates only a driver unit 11 and an auxiliary driver unit 14 among the components of the electronic control unit 1e. FIG. 16 also illustrates a load Ld1 of which the supply of a current is controlled by the electronic control unit 1e.

Here, the load Ld1 is provided between the battery voltage terminal supplied with the battery voltage Vbat and the external output terminal OUT of the electronic control unit 1e. Therefore, in the present example, the drive transistor MN2 as the low-potential-side driver is used for the drive of the load Ld1, and the drive transistor MN1 as the high-potential-side driver is used for discharge of the regenerative current of the load Ld1.

In the electronic control unit 1e, a pre-driver 143 is provided instead of the pre-driver 142. The pre-driver 142 controls the drive of the drive transistor MN1 based on the pulse signal HS; however, the pre-driver 143 controls the drive of the drive transistor MN2 based on the pulse signal LS.

The pre-driver 143 includes constant current sources Id21 and Id22, switching elements SW21 and SW22, switching elements SW23 and SW24, AND circuits AD21 and AD22, and an inverter IV21. The constant current sources Id21 and Id22, the switching elements SW21 and SW22, the switching elements SW23 and SW24, the AND circuits AD21 and AD22, and the inverter IV21 in the pre-driver 143 correspond respectively to the constant current sources Id11 and Id12, the switching elements SW11 and SW12, the switching elements SW13 and SW14, the AND circuits AD11 and AD12, and the inverter IV11 in the pre-driver 142.

The other configurations of the electronic control unit 1e are the same as those of the electronic control unit 1; accordingly, the explanation thereof is omitted.

Figure 17:
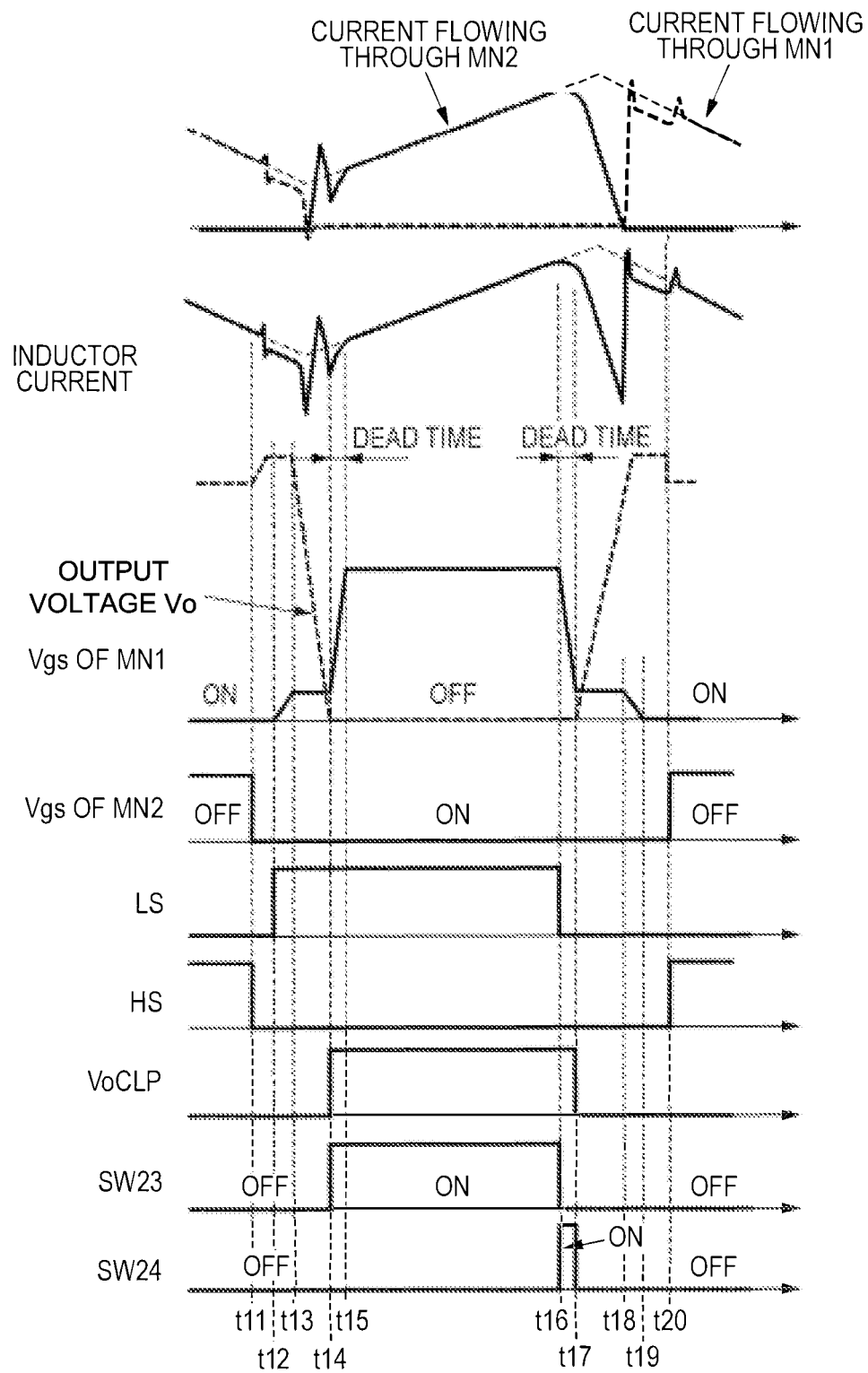
FIG. 17 is a timing chart illustrating operation of the electronic control unit illustrated in FIG. 16.

FIG. 17 is a timing chart illustrating the operation of the electronic control unit 1e. When compared with the timing chart illustrated in FIG. 8, in the timing chart illustrated in FIG. 17, the relation between the current flowing through the drive transistor MN2 and the current flowing through the drive transistor MN1 is reversed. The relation between the H level and the L level of the output voltage Vo is also reversed. Therefore, the voltage monitor 141 outputs the monitored result VoCLP of an H level, when the output voltage Vo falls to reach the reference voltage GND, and outputs the monitored result VoCLP of an L level, when the output voltage Vo exceeds the reference voltage GND. Other operations of the electronic control unit 1e are fundamentally the same as those of the electronic control unit 1; therefore, the explanation thereof is omitted.

The electronic control unit 1e can produce the effect of the same degree as in the electronic control unit 1. When described more specifically, the electronic control unit 1e can improve the current detection accuracy by the current detector unit 12, by shortening the periods other than the plateau period when the gate-to-source voltage Vgs of the drive transistor MN2 indicates a constant value, among the transition periods from OFF to ON and from ON to OFF of the drive transistor MN2, that is, by shortening the period when the current detection cannot be performed with sufficient accuracy.

In the present embodiment, the example in which the voltage monitor 141 monitors the voltage Vo of the external output terminal OUT is explained, however, the present embodiment is not restricted to the example. The voltage monitor 141 may monitor indirectly the voltage Vo of the external output terminal OUT, by monitoring the gate voltage Vg of the drive transistor MN2.

In the present embodiment, the example in which the voltage monitor 141 outputs the monitored result VoCLP of an H level when the output voltage Vo reaches the reference voltage GND is explained, however, the present embodiment is not restricted to the example. The voltage monitor 141 may output the monitored result VoCLP of an H level, when the output voltage Vo reaches an arbitrary prescribed voltage higher than the reference voltage 156 GND.

In the present embodiment, the example in which the pre-driver 143 is provided instead of the pre-driver 142 is explained, however, the present embodiment is not restricted to the example. Both of the pre-drivers 142 and 143 may be provided.

Embodiment 5

Figure 18:
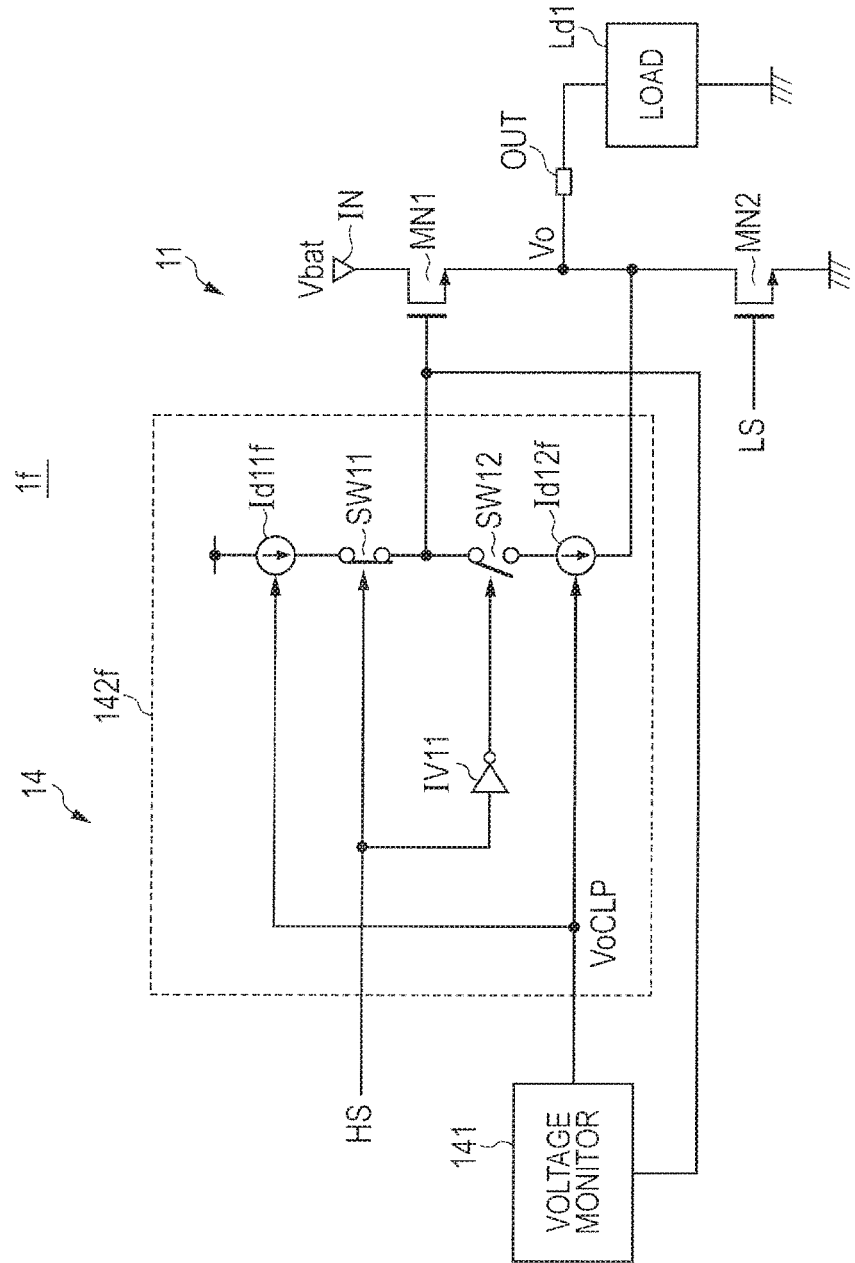
FIG. 18 is a drawing illustrating a part of a concrete example of the configuration of an electronic control unit according to Embodiment 5.

FIG. 18 illustrates a concrete example of the configuration of an electronic control unit if according to Embodiment 5. FIG. 18 illustrates only the driver unit 11 and the auxiliary driver unit 14 among the components of the electronic control unit if. FIG. 18 also illustrates a load Ld1 of which the supply of a current is controlled by the electronic control unit if.

As illustrated in FIG. 18, in the electronic control unit if, the auxiliary driver unit 14 includes a voltage monitor 141 and a pre-driver 142f. When compared with the pre-driver 142, the pre-driver 142f does not includes the AND circuits AD11 and AD12 and the switching elements SW13 and SW14; however, the pre-driver 142f includes a variable-type constant current sources Id11f and Id12f, instead of the constant current sources Id11 and Id12. The other configurations of the electronic control unit if are the same as those of the electronic control unit 1; accordingly, the explanation thereof is omitted.

For example, when the pulse signal HS is at an H level, the switching element SW11 switches to ON and the switching element SW12 switches to OFF, and charges are stored to the gate of the drive transistor MN1 from the constant current source Id11f via the switching element SW11. Accordingly, the drive transistor MN1 changes from OFF to ON. On the other hand, when the pulse signal HS is at an L level, the switching element SW11 switches to OFF and the switching element SW12 switches to ON, and the charges stored in the gate of the drive transistor MN1 is discharged to the external output terminal OUT via the switching element SW12 and the constant current source Id12f. Accordingly, the drive transistor MN1 changes from ON to OFF. Each of the constant current sources Id11f and Id12f switches the value of the constant current selectively based on the monitored result VoCLP of the voltage monitor 141.

For example, when the voltage Vo of the external output terminal OUT is less than the battery voltage Vbat, the monitored result VoCLP of an L level is outputted from the voltage monitor 141, and each of the constant current sources Id11f and Id12f chooses and outputs a first constant current. As opposed to this, when the voltage Vo of the external output terminal OUT has reached the battery voltage Vbat, the monitored result VoCLP of an H level is outputted from the voltage monitor 141, and each of the constant current sources Id11f and Id12f chooses and outputs a second constant current that indicates a greater value than the first constant current.

The electronic control unit if can produce the effect of the same degree as in the electronic control unit 1.

As described above, the electronic control unit according to Embodiment 1-Embodiment 5 can improve the current detection accuracy by the current detector unit, by shortening the periods other than the plateau period when the gate-to-source voltage Vgs of the drive transistor (for example, MN1) indicates a constant value, among the transition periods from OFF to ON and from ON to OFF of the drive transistor used for the drive of the load (for example, MN1), that is, by shortening the period when the current detection cannot be performed with sufficient accuracy.

As described above, the invention accomplished by the present inventors has been concretely explained based on the embodiments. However, it cannot be overemphasized that the present invention is not restricted to the embodiments as described above, and it can be changed variously in the range which does not deviate from the gist.

In Embodiment 1-Embodiment 5 described above, the cases where the load Ld1 is the solenoid valve and the electronic control unit operates as the solenoid driver are explained as an example. However, the present embodiment is not restricted to the example. As long as the load Ld1 includes an inductor, the electronic control unit may be configured so as to operate as a DC-DC converter.

For example, in the semiconductor device according to the above-described embodiments, it is also preferable to invert the conductive types (p-type or n-type) of the semiconductor substrate, the semiconductor layer, and the diffusion layer (diffusion region). Therefore, when it is assumed that one of the conductive types, n-type or p-type, is a first conductive type and the other conductive type is a second conductive type, it is preferable to set the first conductive type as p-type and the second conductive type as n-type. On the contrary, it is also preferable to set the first conductive type as n-type and the second conductive type as p-type.

What is claimed is:

1. A semiconductor device comprising:
   a first drive transistor to control supply of a current flowing through a load;
   a first sense transistor through which a current proportional to the current flowing through the first drive transistor flows;
   a voltage monitor to monitor a voltage of an external output terminal provided between the first drive transistor and the load; and
   a pre-driver that performs charge and discharge to a control terminal of the first drive transistor at a first charge and discharge speed based on a first pulse signal when the voltage of the external output terminal has not reached a prescribed voltage, and that performs charge and discharge to the control terminal of the first drive transistor at a second charge and discharge speed faster than the first charge and discharge speed based on the first pulse signal when the voltage of the external output terminal has reached the prescribed voltage.

2. The semiconductor device according to claim 1, further comprising:
   a current detector unit that includes the first sense transistor; and
   a controller unit to generate the first pulse signal corresponding to a value of a current detected by the current detector unit.

3. The semiconductor device according to claim 2,
   wherein the pre-driver comprises:
   a first switching unit to control the charge and discharge to the control terminal of the first drive transistor based on the first pulse signal; and
   a second switching unit to control the charge and discharge to the control terminal of the first drive transistor based on the first pulse signal in cooperation with the first switching unit, when the voltage of the external output terminal has reached the prescribed voltage.

4. The semiconductor device according to claim 3,
   wherein the second switching unit performs the charge and discharge to the control terminal of the first drive transistor at a charge and discharge speed faster than the charge and discharge speed in the first switching unit.

5. The semiconductor device according to claim 3, wherein the first switching unit comprises:
   a first constant current source provided between a power supply voltage terminal supplied with a power supply voltage and the control terminal of the first drive transistor;
   a first switching element provided in series with the first constant current source and controlled to switch on and off based on the first pulse signal;
   a second constant current source provided between the control terminal of the first drive transistor and the external output terminal; and
   a second switching element provided in series with the second constant current source and controlled to switch on and off based on the first pulse signal in a manner complementary to the first switching element.

6. The semiconductor device according to claim 5, wherein the second switching unit comprises:
   a third switching element provided between the power supply voltage terminal and the control terminal of the first drive transistor and controlled to switch on and off based on the first pulse signal when the voltage of the external output terminal has reached the prescribed voltage; and
   a fourth switching element provided between the control terminal of the first drive transistor and the external output terminal and controlled to switch on and off based on the first pulse signal in a manner complementary to the third switching element when the voltage of the external output terminal has reached the prescribed voltage.

7. The semiconductor device according to claim 2, wherein the pre-driver comprises:
   a first constant current source which is provided between a power supply voltage terminal supplied with a power supply voltage and the control terminal of the first drive transistor and through which a current of a value corresponding to a monitored result by the voltage monitor flows;
   a first switching element provided in series with the first constant current source and controlled to switch on and off based on the first pulse signal;
   a second constant current source which is provided between the control terminal of the first drive transistor and the external output terminal and through which a current of a value corresponding to the monitored result by the voltage monitor flows; and
   a second switching element provided in series with the second constant current source and controlled to switch on and off based on the first pulse signal in a manner complementary to the first switching element.

8. The semiconductor device according to claim 7, wherein, when the voltage of the external output terminal has reached the prescribed voltage, each of the first constant current source and the second constant current source makes flow a current of a greater value than the current when the voltage of the external output terminal has not reached the prescribed voltage.

9. The semiconductor device according to claim 2, wherein the first drive transistor is a high-potential-side driver provided between a voltage supplying terminal supplied with a battery voltage and the external output terminal, and
   wherein the voltage monitor monitors whether the voltage of the external output terminal has reached a voltage equal to or greater than the prescribed voltage.

10. The semiconductor device according to claim 9, wherein the prescribed voltage is the battery voltage.

11. The semiconductor device according to claim 2, wherein the first drive transistor is a low-potential-side driver provided between a reference voltage terminal supplied with a reference voltage and the external output terminal, and
   wherein the voltage monitor monitors whether the voltage of the external output terminal has reached a voltage equal to or less than the prescribed voltage.

12. The semiconductor device according to claim 11, wherein the prescribed voltage is the reference voltage.

13. The semiconductor device according to claim 2, wherein the voltage monitor comprises:
   a comparator to compare the voltage of the external output terminal with the prescribed voltage and to output a comparison result as a monitored result.

14. The semiconductor device according to claim 2, wherein the voltage monitor comprises:
   a clamping circuit to clamp the voltage of the external output terminal equal to or less than a clamp voltage to the clamp voltage; and
   a level shifter to level-shift the output voltage of the clamping circuit and to output the level-shifted voltage as a monitored result.

15. The semiconductor device according to claim 2, further comprising:
   a sample hold circuit to sample a detection current of the current detector unit at a timing corresponding to on-and-off switching of the first drive transistor and to hold the sampled value for a prescribed period.

16. The semiconductor device according to claim 2, wherein the load is a solenoid driver.

17. The semiconductor device according to claim 2, wherein the load includes an inductor.

18. A semiconductor system comprising:
   the semiconductor device according to claim 2; and
   the load driven by the semiconductor device.

* * * * *